United States Patent
Won et al.

(10) Patent No.: US 11,421,073 B2
(45) Date of Patent: Aug. 23, 2022

(54) HIGHLY THERMALLY CONDUCTIVE EPOXY COMPOUND, AND COMPOSITION, MATERIAL FOR SEMICONDUCTOR PACKAGE, MOLDED PRODUCT, ELECTRIC AND ELECTRONIC DEVICE AND SEMICONDUCTOR PACKAGE INCLUDING THE SAME

(71) Applicant: Samsung Electronics Co., Ltd., Suwon-si (KR)

(72) Inventors: Jonghoon Won, Yongin-si (KR); In Kim, Suwon-si (KR); Kyeong Pang, Suwon-si (KR); Mooho Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/061,345

(22) Filed: Oct. 1, 2020

(65) Prior Publication Data
US 2021/0147613 A1    May 20, 2021

(30) Foreign Application Priority Data
Nov. 14, 2019  (KR) .......................... 10-2019-0145923

(51) Int. Cl.
*C08G 59/24*   (2006.01)
*C08K 3/013*   (2018.01)
(Continued)

(52) U.S. Cl.
CPC ......... *C08G 59/245* (2013.01); *C08G 59/621* (2013.01); *C08K 3/013* (2018.01);
(Continued)

(58) Field of Classification Search
CPC .... C08G 59/245; C08G 59/621; C08K 3/013; C08K 2201/001; C09K 19/322; C09K 19/3804; C09K 2019/323; H01L 21/565
(Continued)

(56) References Cited

U.S. PATENT DOCUMENTS 9,617,476 B2   4/2017  Chen et al.
10,597,371 B2  3/2020  Horiguchi et al.
(Continued)

FOREIGN PATENT DOCUMENTS

CN   102314015 A   1/2012
CN   103059036 A   4/2013
(Continued)

OTHER PUBLICATIONS

Lee et al., "Synthesis and Curing of Liquid Crystalline Epoxy Resin Based on Naphthalene Mesogen", Journal of Polymer Science Part A: Polymer Chemistry, 1999, vol. 37, p. 419-425 (Year: 1999).*
(Continued)

*Primary Examiner* — David T Karst
(74) *Attorney, Agent, or Firm* — Cantor Colburn LLP

(57) ABSTRACT

A highly thermally conductive epoxy compound, and a composition, a material for a semiconductor package, a molded product, an electric and electronic device, and a semiconductor package, each including the highly thermally conductive epoxy compound. The epoxy compound is represented by Chemical Formula 1 below and has at least one mesogenic naphthalene unit.

$E_1\text{-}M_1\text{-}L_1\text{-}M_2\text{-}L_2\text{-}M_3\text{-}E_2$    Chemical Formula 1

In Chemical Formula 1, at least one of $M_1$, $M_2$, or $M_3$, which are mesogenic units, is a naphthalene unit. $M_1$, $M_2$, $M_3$, $L_1$, $L_2$, and $E_1$ and $E_2$ are as defined in the detailed description.

18 Claims, 7 Drawing Sheets

(51) Int. Cl.
    *C09K 19/38*     (2006.01)
    *C09K 19/32*     (2006.01)
    *C08G 59/62*     (2006.01)
    *H01L 21/56*     (2006.01)

(52) U.S. Cl.
    CPC ........ *C09K 19/322* (2013.01); *C09K 19/3804* (2013.01); *H01L 21/565* (2013.01); *C08K 2201/001* (2013.01); *C09K 2019/323* (2013.01)

(58) Field of Classification Search
    USPC .......................................................... 528/98
    See application file for complete search history.

(56) References Cited

U.S. PATENT DOCUMENTS

| | | |
|---|---|---|
| 2005/0224757 A1 | 10/2005 | Syundo et al. |
| 2009/0323011 A1 | 12/2009 | He et al. |
| 2010/0117027 A1 | 5/2010 | Hirai et al. |
| 2014/0213751 A1* | 7/2014 | Fukuzaki ............. C08G 59/621 528/89 |
| 2019/0218459 A1 | 7/2019 | Song et al. |
| 2021/0147612 A1 | 5/2021 | Pang et al. |

FOREIGN PATENT DOCUMENTS

| | | | |
|---|---|---|---|
| EP | 0724006 A1 | 7/1996 | |
| JP | 2008133344 A | 6/2008 | |
| JP | 2012131960 A * | 7/2012 | ............ C07C 69/94 |
| JP | 2013032340 A | 2/2013 | |
| KR | 1020120100506 A | 9/2012 | |
| KR | 10-2021-0058569 A | 5/2021 | |
| WO | 2014201997 A1 | 12/2014 | |
| WO | 2016136533 A1 | 9/2016 | |
| WO | 2018060110 A1 | 4/2018 | |

OTHER PUBLICATIONS

Asaumi et al., JP 2012-131960 A machine translation in English, Jul. 12, 2012 (Year: 2012).*
Espinosa et al., "New Cholesteric Liquid-Crystal Epoxy Resins Derived from 6-Hydroxy-2-naphthoic Acid", Journal of Polymer Science: Part A: Polymer Chemistry, 2001, vol. 39, p. 2847-2858 (Year: 2001).*
English Abstract of CN 102314015, Jan. 11, 2012.
English Abstract of CN103059036, Apr. 24, 2013.
English Abstract of JP 2013-032340, Feb. 14, 2013.
English Abstract of JP2008-133344, Jun. 12, 2008.
English Abstract of KR10-2012-0100506, Sep. 12, 2012.

* cited by examiner

HIGHLY THERMALLY CONDUCTIVE EPOXY COMPOUND, AND COMPOSITION, MATERIAL FOR SEMICONDUCTOR PACKAGE, MOLDED PRODUCT, ELECTRIC AND ELECTRONIC DEVICE AND SEMICONDUCTOR PACKAGE INCLUDING THE SAME

CROSS-REFERENCE TO RELATED APPLICATION

This application claims priority to Korean Patent Application No. 10-2019-0145923, filed on Nov. 14, 2019 in the Korean Intellectual Property Office, and all benefits accruing therefrom under 35 U.S.C. § 119, the entire content of which is herein incorporated by reference.

BACKGROUND

1. Field

This disclosure relates to a highly thermally conductive epoxy compound, a composition, a material for a semiconductor package, a molded product, an electric and electronic device, and a semiconductor package, each including the highly thermally conductive epoxy compound or composition. The highly thermally conductive epoxy compound may be applied in various electric and electronic fields requiring heat dissipating properties as well as semiconductors, and a composition, a material for a semiconductor package, a molded product, an electric and electronic device, and a semiconductor package, each including the highly thermally conductive epoxy compound or composition.

2. Description of the Related Art

In accordance with the development of electronic devices, semiconductors have become lighter, thinner, and smaller in dimensional size, and thus semiconductor circuits have become more complicated with greater circuit density. Following such trends, the electric, thermal, and mechanical stability of molding materials becomes an ever more important factor. Particularly, heating issues generated in the application processor (AP) of mobile products may have great influences on the performance and reliability of the mobile products. Molding is an encapsulating process of a semiconductor using a mold compound resulting in a semiconductor package for protecting a semiconductor chip from the external environment, and may include achieving electric insulating effects, and effectively dissipating heat during operation of a chip. Practically, the purpose of molding is to protect a semiconductor that may include wire bonding or flip chip bonding from electrical deterioration. Electrical deterioration may be due to various factors including corrosion by exposure to air (oxygen) or other oxidizing external contaminants, and molding provides the necessary mechanical stability as well as effectively releasing heat generated from the semiconductor during operation.

Generally, an epoxy molding compound (EMC), which is a thermosetting resin, is used as a molding material of a semiconductor package. However, the epoxy molding compound has limitations in terms of thermal expansion coefficient (CTE), warpage, and thermal conductivity. To address some or most of the limitations, a method of adding a relatively large amount of a highly thermally conductive inorganic filler to the EMC is often used. However, an increase in the thermal conductivity of a composite material has a limit even if the thermal conductivity of the conductive inorganic filler is increased to about 100 watts per meter-Kelvin (W/mK) or greater. In particular, in the case of EMCs, the thermal conductivity of a final product cannot go beyond about 5 W/mK, even if 90% or more of the filler content is present in an EMC composition. Moreover, as the filler loading content increases, one may exhibit an increase degradation of mechanical properties. Accordingly, a molding composition which is capable of achieving high thermal conductivity, and also limits or minimizes the amount of inorganic filler in an EMC composition is of interest.

Accordingly, the development or improvement of a highly thermally conductive material that is applicable to the semiconductor and electronic device fields with heat dissipating properties is greatly sought and necessary.

SUMMARY

An aspect of the disclosure is to provide a highly thermally conductive epoxy compound, i.e., an epoxy compound having high heat dissipating properties.

Another aspect of the disclosure is to provide a composition including the highly thermally conductive epoxy compound.

Further another aspect of the disclosure is to provide a material for a semiconductor package, the package including the highly thermally conductive epoxy compound.

Further another aspect of the disclosure is to provide a molded product obtained with the highly thermally conductive epoxy compound.

Further another aspect of the disclosure is to provide an electric and electronic device including the highly thermally conductive epoxy compound.

Further another aspect of the disclosure is to provide a semiconductor package including the highly thermally conductive epoxy compound.

Additional aspects will be set forth in part in the description which follows and, in part, will be apparent from the description, or may be learned by practice of the presented embodiments of the disclosure.

According to an aspect of the disclosure, there is provided an epoxy compound having a naphthalene unit, represented by Chemical Formula 1 below.

$$E_1\text{-}M_1\text{-}L_1\text{-}M_2\text{-}L_2\text{-}M_3\text{-}E_2 \quad \text{Chemical Formula 1}$$

In Chemical Formula 1, $M_1$, $M_2$, and $M_3$ are each independently a mesogenic unit represented by Chemical Formula 2 below, where at least one of $M_1$, $M_2$, or $M_3$ is a naphthalene unit represented by Formula (2-1), $L_1$ and $L_2$ are each independently a single bond, —O—, —C(=O)O—, —O—C(=O)—, —O—C(=O)O—, —(CH$_2$)$_2$—C(=O)—, —C(=O)—(CH$_2$)$_2$—, —CH=CH—C(=O)—, —C(=O)—CH=CH—, —S(=O)—, —CH=N—, —N=CH—, —NHC(=O)O—, —OC(=O)NH—, —C(=O)NH—, —NHC(=O)—, —OC(=O)NHS(=O)O—, —OS(=O)NHC(=O)O—, —CH$_2$(C$_6$H$_4$)C(=O)—, or —C(=O)(C$_6$H$_4$)CH$_2$—, and $E_1$ and $E_2$ are the same or different epoxy-containing group.

Chemical Formula 2

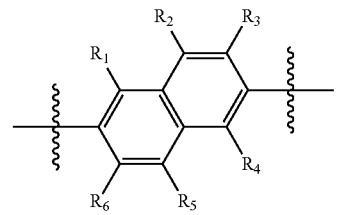

(2-1)

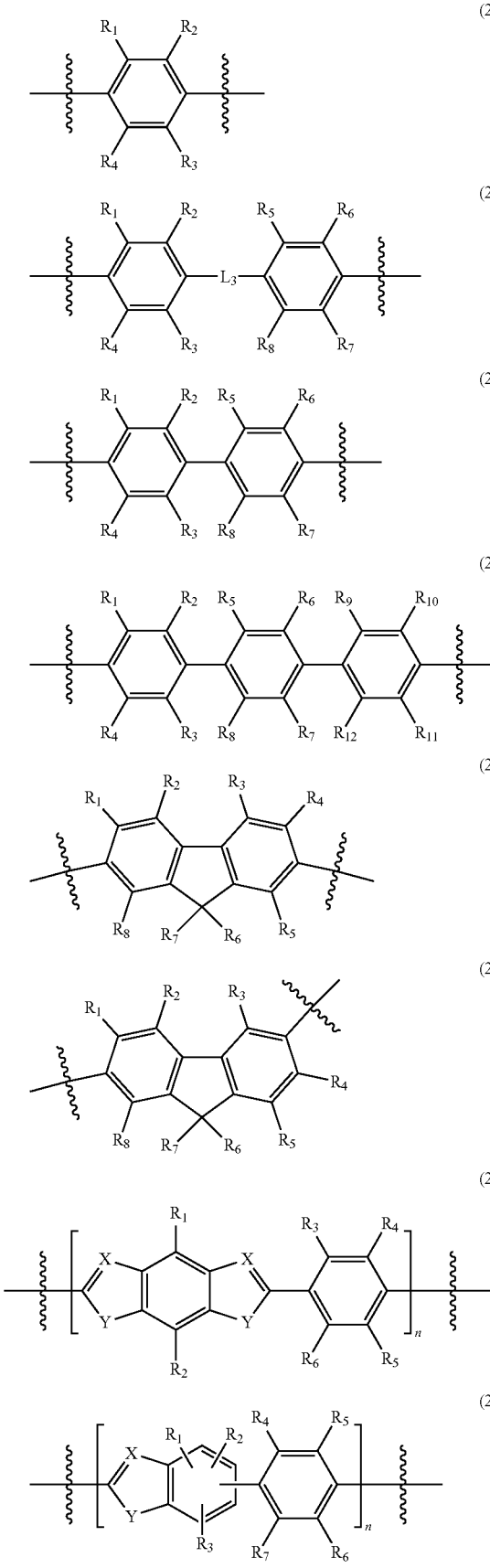

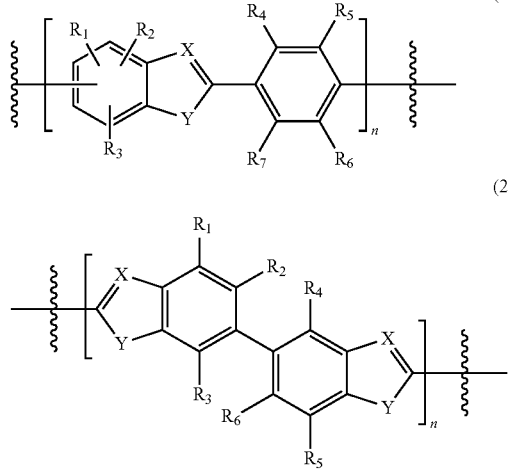

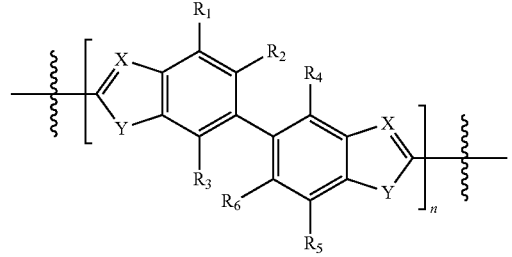

In Chemical Formula 2, $R_1$ to $R_{12}$ are each independently a hydrogen atom, a halogen atom, an alkyl group of C1-C30, an alkenyl group of C2-C30, an alkynyl group of C2-C30, a C1-C30 alkoxy group, a C2-C30 alkoxyalkyl group, a C1-C30 heteroalkyl group, an aryl group of C6-C30, an arylalkyl group of C7-C30, a heteroaryl group of C2-C30, a heteroarylalkyl group of C3-C30, a heteroaryloxy group of C2-C30, a heteroaryloxyalkyl group of C3-C30, a heteroarylalkyloxy group of C3-C30, a hydroxyl group, a nitro group, a cyano group, an amino group, an amidino group, a hydrazine group, a hydrazone group, a carboxyl group or a salt thereof, a sulfonyl group, a sulfamoyl group, a sulfonic acid group or a salt thereof, or phosphoric acid group or a salt thereof, $L_3$ of chemical formula (2-3) is —O—, —C(=O)O—, —O—C(=O)—, —O—C(=O)O—, —(CH$_2$)$_2$—C(=O)—, —C(=O)—(CH$_2$)$_2$—, —CH=CH—C(=O)—, —C(=O)—CH=CH—, —S(=O)—, —CH=N—, —N=CH—, —NHC(=O)O—, —OC(=O)NH—, —C(=O)NH—, —NHC(=O)—, —OC(=O)NHS(=O)O—, —OS(=O)NHC(=O)O—, —CH$_2$(C$_6$H$_4$)C(=O)—, or —C(=O)(C$_6$H$_4$)CH$_2$—, X is N, P, or As, Y is O, S, or Se, and n is an integer of 1 to 10.

According to another aspect of the disclosure, there is provided a composition including the epoxy compound.

According to further another aspect of the disclosure, there is provided a material for a semiconductor package, including the epoxy compound.

According to further another aspect of the disclosure, there is provided a molded product including the epoxy compound or a cured product thereof.

According to further another aspect of the disclosure, there is provided an electric and electronic device including the epoxy compound or a cured product thereof.

According to further another aspect of the disclosure, there is provided a semiconductor package including:
a substrate,
at least one chip mounted on the substrate,
a connecting portion for electrically connecting the at least one chip and the substrate, and
a molding portion encapsulating the at least one chip on the substrate, wherein the molding portion is formed using the composition.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
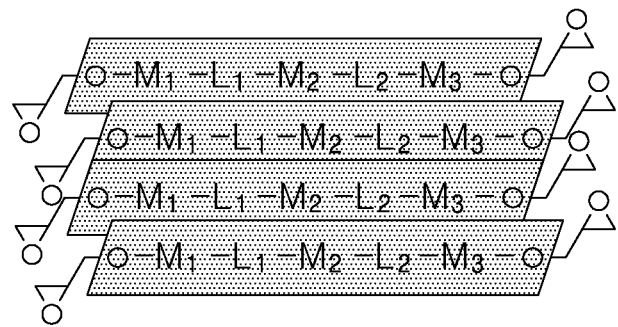
FIG. 1 is a schematic diagram for explaining the molecular design principle of an epoxy compound according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. It will be understood that when an element is referred to as being "on" another element, it can be directly on the other element or intervening elements may be present therebetween. In contrast, when an element is referred to as being "directly on" another element, there are no intervening elements present.

The present inventive concept described below may be modified in various forms and have many embodiments, and particular embodiments are illustrated in the drawings and described in detail in the detailed description. However, the present inventive concept should not be construed as limited to the particular embodiments, but should be understood to cover all modifications, equivalents or replacements included in the technical scope of the present inventive concept.

The terms herein are merely used to describe particular embodiments, and are not intended to limit the present inventive concept. The singular forms include the plural forms as well, unless the context clearly indicates otherwise. It will be further understood that the terms "comprise" or "comprising" when used herein, specify the presence of stated features, numbers, steps, operations, elements, parts, components, materials, or combinations thereof, but do not preclude the presence or addition of one or more other features, numbers, steps, operations, elements, parts, components, materials, or combinations thereof disclosed in the specification, and are not intended to preclude the possibility that one or more otherfeatures, numbers, steps, actions, components, parts, ingredients, materials, or combinations thereof may exist or may be added.

In the drawings, the thicknesses of layers and regions are enlarged or reduced for clear explanation. The same reference numerals are marked for similar elements throughout.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within±20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Hereinafter, according to example embodiments, a material for a semiconductor package, a molding composition for a semiconductor package and a semiconductor package using the same according to example embodiments will be described in detail.

In related art, there are operational limitations to increasing the thermal conductivity of a filler, and although the thermal conductivity of a filler may be as high as about 100 W/mK, it can be very difficult, or nearly impossible, to achieve a thermal conductivity of a final composite material of about 5 W/mK or greater.

Figure 2:
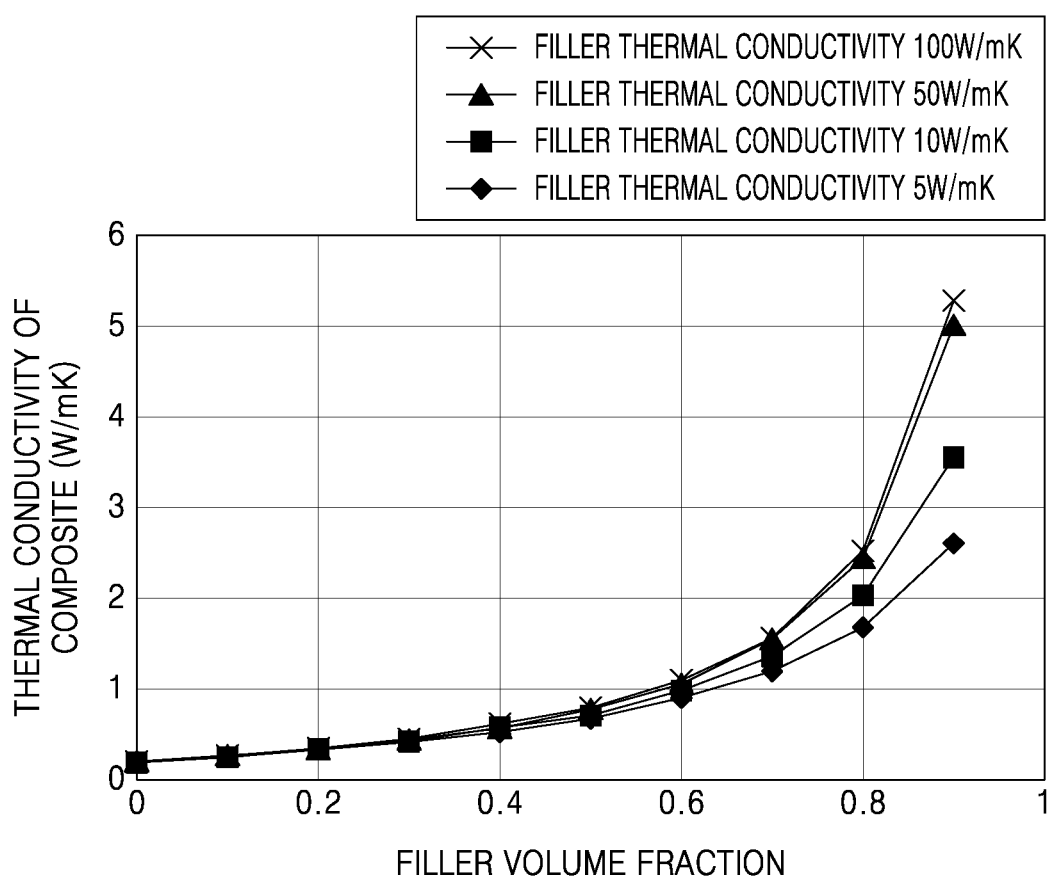
FIG. 2 is a graph showing the changes in thermal conductivity of a composite material according to the thermal conductivity of a filler.

FIG. 2 is a graph showing the thermal conductivity change of a composite material in accordance with the thermal conductivity of a filler. The FIG. 2 plots of thermal conductivity are calculated based on Maxwell Model as the filler content is increased from 0% by volume to 90% by volume in a commonly used polymer resin having a thermal conductivity of about 0.2 W/mK. As shown in the plots, it is confirmed that if the filler content is about 90%, there is little, if any, difference in the thermal conductivity of a final composite material if one was to use a filler with a thermal conductivity of about 50 W/mK or greater.

A polymer material may be a thermal insulator and is known to have a bulk thermal conductivity of about 0.2 W/mK or less, for example, in a range of about 0.1 W/mK to about 0.3 W/mK, or about 0.1 W/mK to about 0.2 W/mK, in case of a thermosetting polymer which may be used as a material for a semiconductor package.

In the case of an insulating polymer, because heat transfer is governed by the vibration transfer of phonon, a polymer that maximizes the path of the phonon and minimizes the scattering of the phonon may enhance the heat transfer characteristics of the polymer, and therefore, reduce the insulating effectiveness of the polymer.

Figure 3:
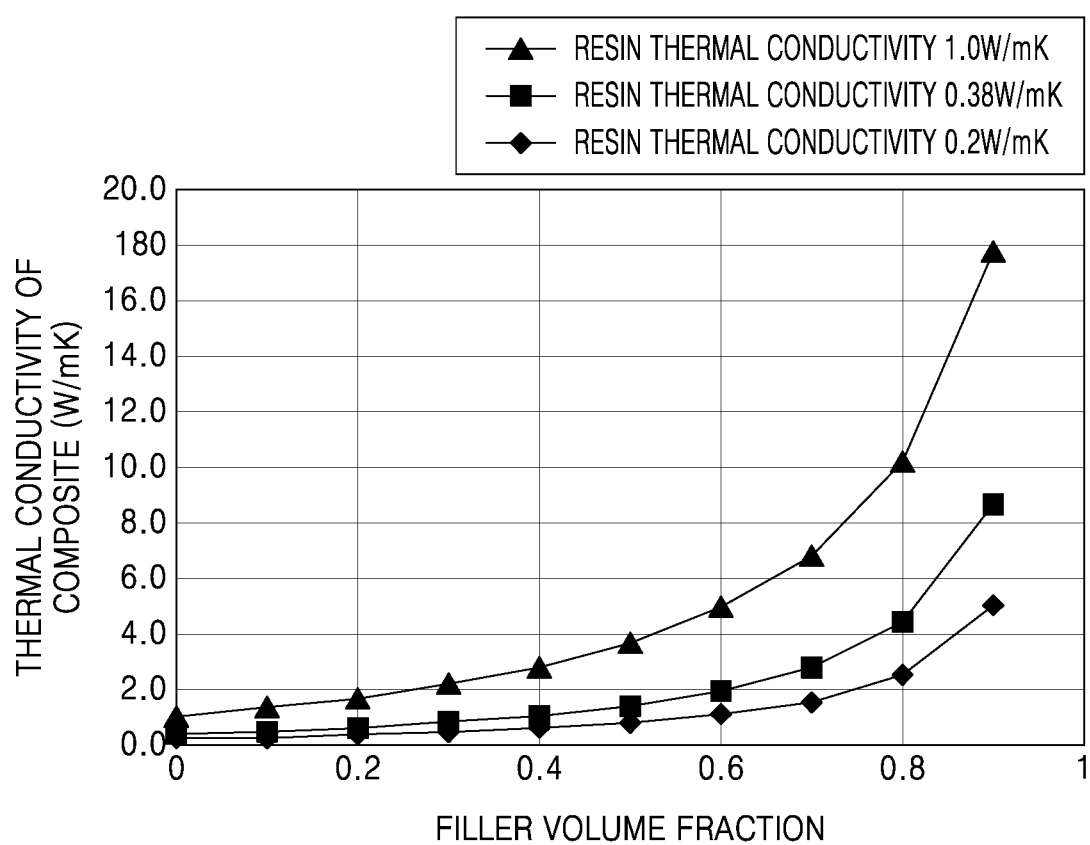
FIG. 3 is a graph showing the changes in thermal conductivity of a composite material according to the thermal conductivity of a polymer.

FIG. 3 is a graph showing a change in the thermal conductivity of a composite material (polymer plus filler) in accordance with the thermal conductivity of a polymer. The data plots, which are based on Maxwell model, depict changes in thermal conductivity values of a composite material for a given filler ($Al_2O_3$) with thermal conductivity of about 50 W/mK, while increasing the thermal conductivity of a polymer resin from about 0.2 W/mK to about 1.0 W/mK. In reference to FIG. 3, which is different from the case of increasing the thermal conductivity of the filler (see FIG. 2), we can confirm that if the thermal conductivity of the resin is increased from about 0.2 W/mK to about to 1.0 W/mK, the thermal conductivity of the composite material may increase up to 18 W/mK with a filler content of 90%.

Accordingly, we realized that one may increase the thermal conductivity of a composite material by select design of the path of phonons through π-π stacking, e.g., by introducing π-conjugation using a mesogenic unit into the main chain structure of a thermosetting epoxy compound that can enhance chain stiffness.

An epoxy compound according to an embodiment is represented by the following Chemical Formula 1 and has a naphthalene unit:

$$E_1\text{-}M_1\text{-}L_1\text{-}M_2\text{-}L_2\text{-}M_3\text{-}E_2 \quad \text{Chemical Formula 1}$$

wherein in Chemical Formula 1, $M_1$, $M_2$, and $M_3$ are each independently a mesogenic unit represented by Chemical Formula 2, where at least one of $M_1$, $M_2$, or $M_3$ is a naphthalene unit represented by Formula (2-1), $L_1$ and $L_2$ are each independently a single bond, —O—, —C(=O)O—, —O—C(=O)—, —O—C(=O)O—, —(CH$_2$)$_2$—C(=O)—, —C(=O)—(CH$_2$)$_2$—, —CH=CH—C(=O)—, —C(=O)—CH=CH—, —S(=O)—, —CH=N—, —N=CH—, —NHC(=O)O—, —OC(=O)NH—, —C(=O)NH—, —NHC(=O)—, —OC(=O)NHS(=O)O—, —OS(=O)NHC(=O)O—, —CH$_2$(C$_6$H$_4$)C(=O)—, or —C(=O)(C$_6$H$_4$)CH$_2$—, and $E_1$ and $E_2$ are the same or different epoxy-containing group;

Chemical Formula 2

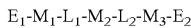

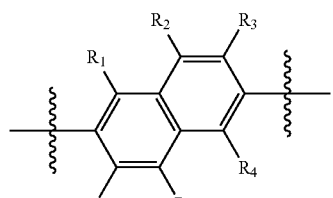
(2-1)

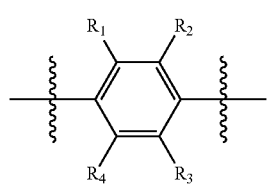
(2-2)

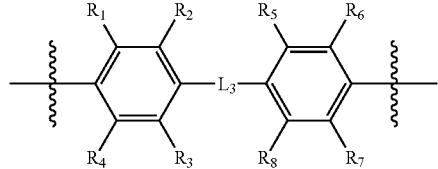
(2-3)

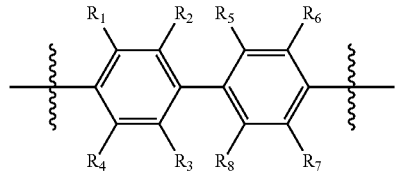
(2-4)

-continued

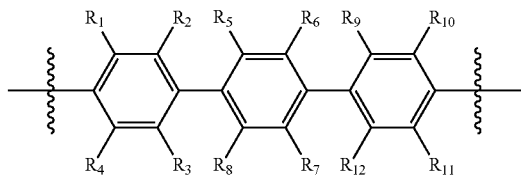
(2-5)

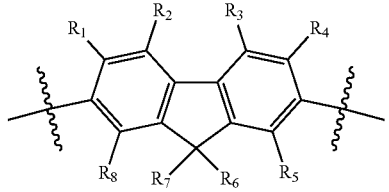
(2-6)

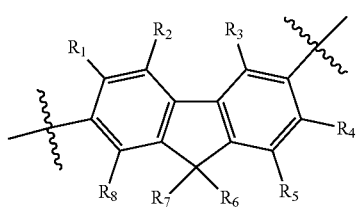
(2-7)

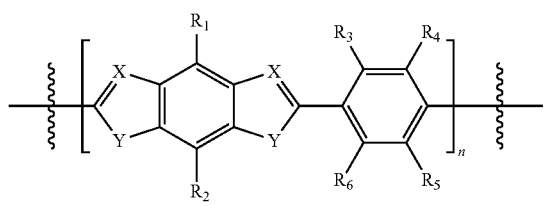
(2-8)

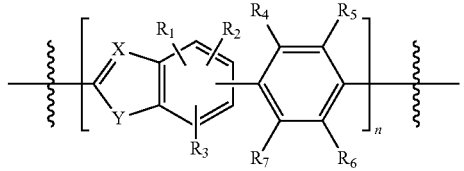
(2-9)

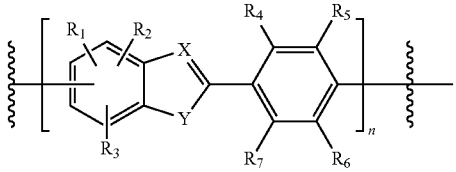
(2-10)

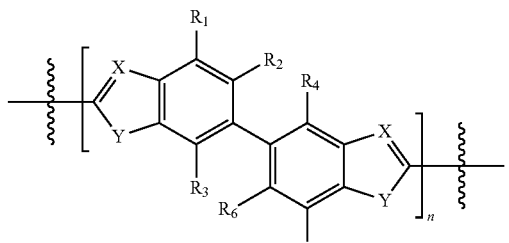
(2-11)

wherein in Chemical Formula 2, $R_1$ to $R_{12}$ are each independently a hydrogen atom, a halogen atom, an alkyl group of C1-C30, an alkenyl group of C2-C30, an alkynyl group of C2-C30, a C1-C30 alkoxy group, a C2-C30 alkoxyalkyl group, a C1-C30 heteroalkyl group, an aryl group of C6-C30, an arylalkyl group of C7-C30, a heteroaryl group of C2-C30, a heteroarylalkyl group of C3-C30, a heteroaryloxy group of C2-C30, a heteroaryloxyalkyl group of C3-C30, a heteroarylalkyloxy group of C3-C30, a hydroxyl group, a nitro group, a cyano group, an amino group, an amidino group, a hydrazine group, a hydrazone group, a carboxyl group or a salt thereof, a sulfonyl group, a sulfamoyl group, a sulfonic acid group or a salt thereof, or phosphoric acid group or a salt thereof, $L_3$ of chemical formula (2-3) is —O—, —C(=O)O—, —O—C(=O)—, —O—C(=O)O—, —(CH$_2$)$_2$—C (=O)—, —C(=O)—(CH$_2$)$_2$—, —CH=CH—C(=O)—, —C(=O)—CH=CH—, —S(=O)—, —CH=N—, —N=CH—, —NHC(=O)O—, —OC(=O)NH—, —C(=O)NH—, —NHC(=O)—, —OC(=O)NHS(=O) O—, —OS(=O)NHC(=O)O—, —CH$_2$(C$_6$H$_4$)C(=O)—, or —C(=O)(C$_6$H$_4$)CH$_2$—, X is N, P, or As, Y is O, S, or Se, and n is an integer of 1 to 10.

The term "naphthalene unit" refers to a bivalent naphthyl group that is unsubstituted or substituted with one to six hydrogens replaced with a substituent as defined herein. Moreover, each ring of the naphthyl group accounts for one of the bivalent connective points to an adjacent mesogenic unit or epoxy-containing group (terminal group).

FIG. 1 is a schematic diagram that illustrates the molecular design principle of an epoxy compound according to an embodiment. Referring to FIG. 1, the epoxy compound introduces a mesogenic unit into a main chain structure, and π-π stacking by π-conjugation between epoxy compounds is possible. Accordingly, the epoxy compound may form a resin cured product having an arranged structure with relatively strong interactions between mesogenic units. The molecularly arranged structure may facilitate phonon vibration transfer between mesogenic units and in the same direction, and result in enhanced or improved active heat transfer with a corresponding increase in thermal conductivity of the epoxy compound.

The mesogenic unit means a functional group which may exhibit liquid crystallinity in an epoxy compound as described herein. The epoxy compound includes three mesogenic units, which are the same or different, and are independently represented by Chemical Formula 2. In Chemical Formula 2,

refers to a connection point with another linking group such as $L_1$ or $L_2$, or an epoxy-containing group.

In the epoxy compound, at least one or more of the three mesogenic units, $M_1$, $M_2$, or $M_3$, include the naphthalene unit represented by Formula (2-1) of Chemical Formula 2.

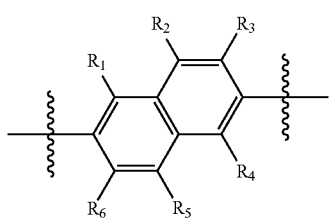

(2-1)

The epoxy compound includes one or more naphthalene units, and may increase the π-π stacking effects between adjacent epoxy compounds, reinforce the interaction between mesogenic units between the epoxy compounds in a stacked state, and further improve intermolecular stacking and alignment. Accordingly, the epoxy compound may further enhance the heat transfer between intermolecular mesogenic units to improve thermal conductivity.

In Chemical Formula 2, $R_1$ to $R_{12}$ may be each independently a hydrogen atom, a halogen atom, an alkyl group of C1-C30, an alkenyl group of C2-C30, an alkynyl group of C2-C30, a C1-C30 alkoxy group, a C2-C30 alkoxyalkyl group, a C1-C30 heteroalkyl group, an aryl group of C6-C30, an arylalkyl group of C7-C30, a heteroaryl group of C2-C30, a heteroarylalkyl group of C3-C30, a heteroaryloxy group of C2-C30, a heteroaryloxyalkyl group of C3-C30, a heteroarylalkyloxy group of C3-C30, a hydroxyl group, a nitro group, a cyano group, an amino group, an amidino group, a hydrazine group, a hydrazone group, a carboxyl group or a salt thereof, a sulfonyl group, a sulfamoyl group, a sulfonic acid group or a salt thereof, or phosphoric acid group or a salt thereof. For example, $R_1$ to $R_{12}$ may be each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group, and particularly, for example, a hydrogen atom or a C1-C10 alkyl group.

According to an embodiment, at least six of $R_1$ to $R_{12}$, preferably, at least eight of $R_1$ to $R_{12}$, are a hydrogen atom, i.e. not substituted. Still in another embodiment, $R_1$ to $R_{12}$ are each hydrogen. The smaller the size or number of the substituents of $R_1$ to $R_{12}$, the greater the opportunity for the arranged stacking of the epoxy compound, e.g., the π-π stacking of adjacent epoxy compounds.

According to an embodiment, the mesogenic units may be at least one of the following Chemical Formula 2a:

Chemical Formula 2A

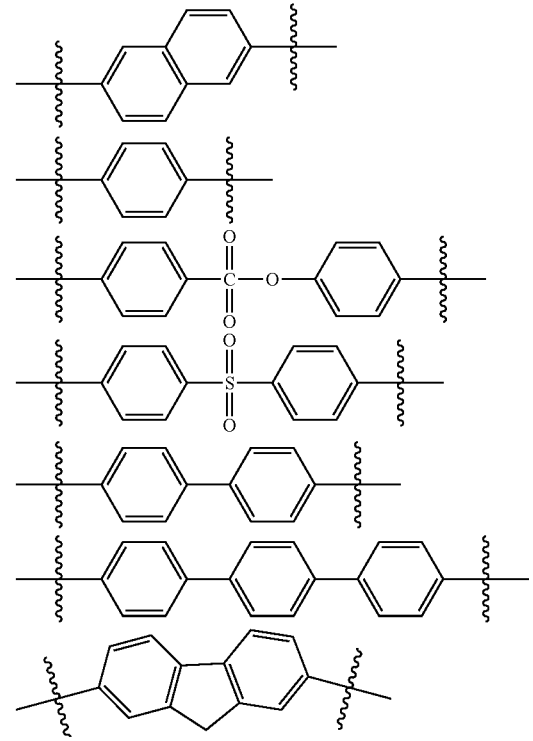

-continued

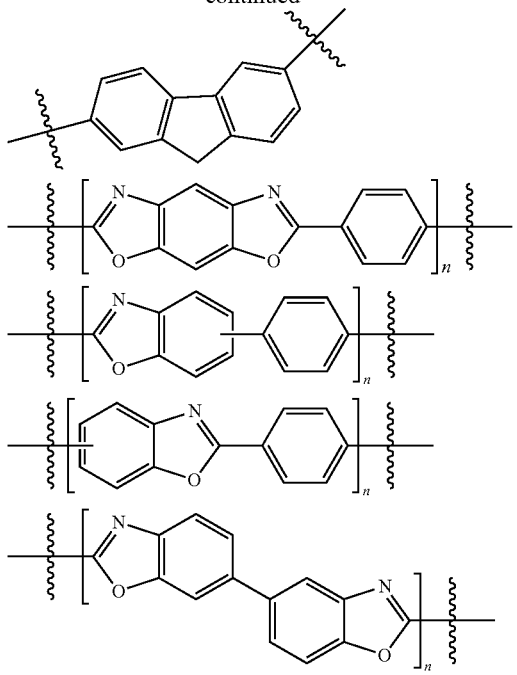

-continued

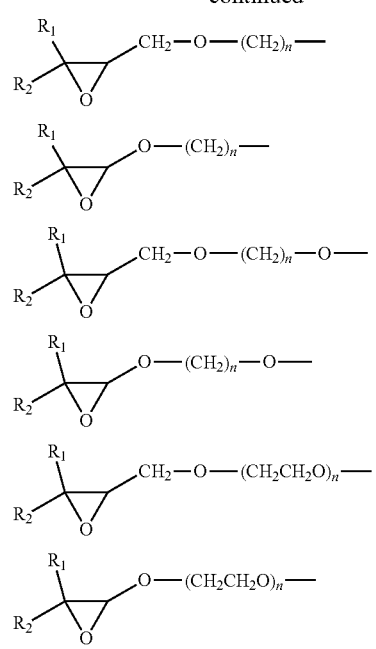

wherein in Chemical Formula 2a, n is an integer of 1 to 10.

According to an embodiment, in the epoxy compound of Chemical Formula 1, $M_1$ and $M_3$ may be the same mesogenic unit.

For example, in the epoxy compound of Chemical Formula 1, $M_1$ or $M_3$, or both of $M_1$ and $M_3$, may be naphthalene units, and $M_2$ may be a mesogenic unit of Chemical Formula 2, but does not include a naphthalene unit.

In the epoxy compound, if $M_1$ and $M_3$ have the same mesogenic unit, particularly, a naphthalene unit, the resulting structure may result in an increase in symmetry. Moreover, the symmetric structure may provide an increase in the overall π-π stacking of adjacent epoxy compounds, i.e., a stronger stacking interaction, and thus, a more regular or consistent molecular alignment, and therefore, an even greater increase in thermal conductivity.

In Chemical Formula 1, epoxy-containing groups are positioned at both terminals in the lengthwise direction of the mesogenic unit which is included in the main chain of the epoxy compound. Through the location of the epoxy-containing groups not at the side chain in the lengthwise direction but at both terminals of the mesogenic unit, a favorable structure for π-π stacking is formed.

The epoxy-containing group, $E_1$ and $E_2$, include an epoxy group which means —O— bonded to two carbon atoms which are bonded to one carbon chain, and according to an embodiment, the epoxy-containing group in the epoxy compounds of Chemical Formula 1 is independently represented by a group of Chemical Formula 3:

Chemical Formula 3

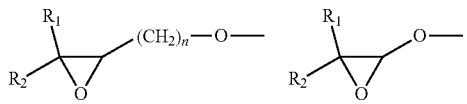

wherein in Chemical Formula 3, $R_1$ and $R_2$ are each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group, and n is an integer of 1 to 10.

For example, the epoxy-containing groups, $E_1$ and $E_2$ are each independently represented by a group of Chemical Formula 3a, but is not limited thereto:

Chemical Formula 3a

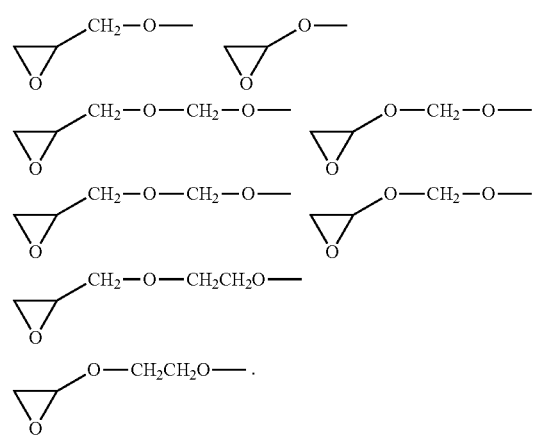

In an embodiment, $E_1$ and $E_2$ are the same epoxy group. According to an embodiment, the epoxy compound may include at least one compound of Chemical Formula 4, but is only illustration and is not limited thereto:

Chemical Formula 4
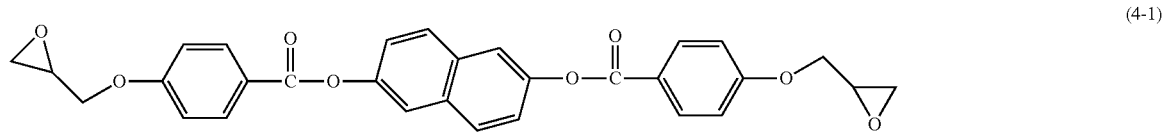
(4-1)
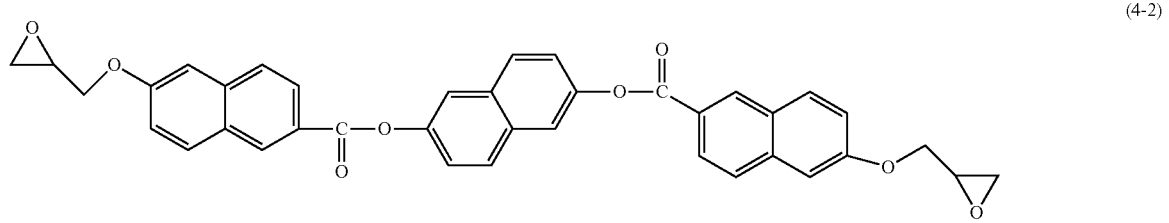
(4-2)
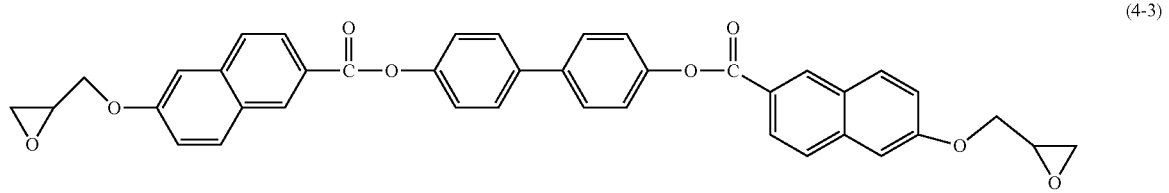
(4-3)
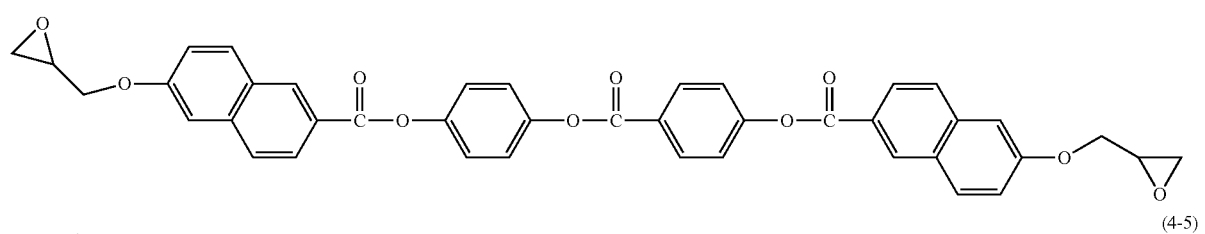
(4-4)
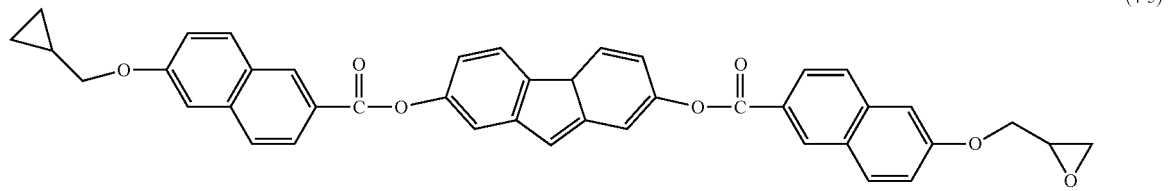
(4-5)
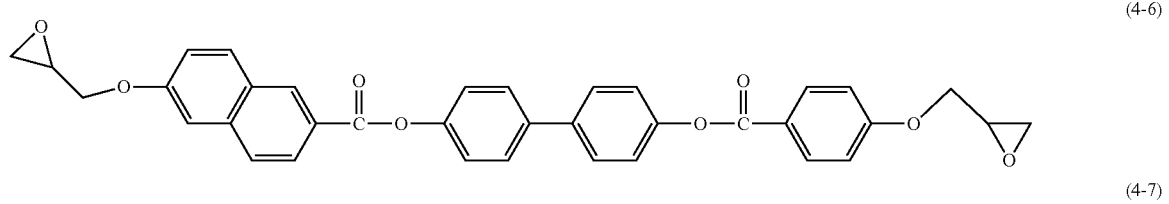
(4-6)
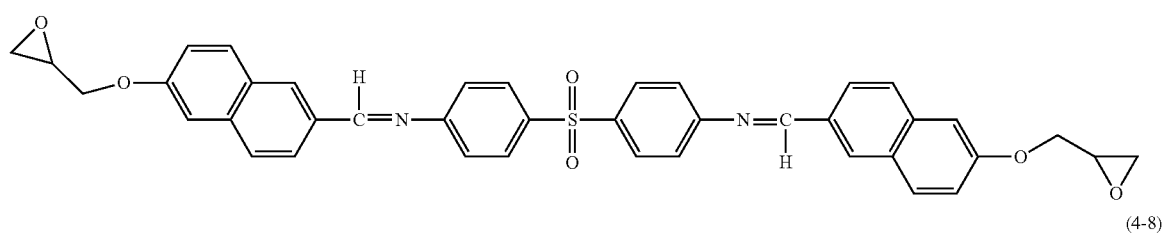
(4-7)
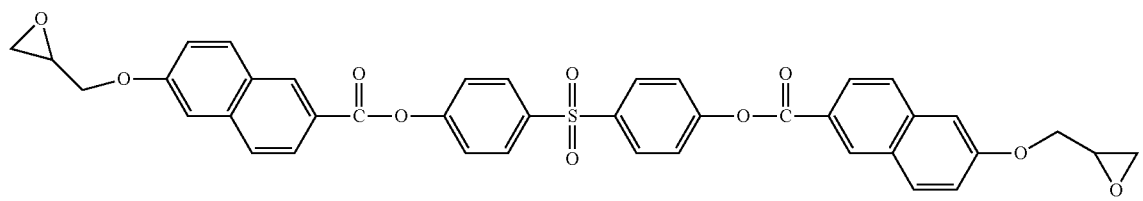
(4-8)

-continued (4-9)

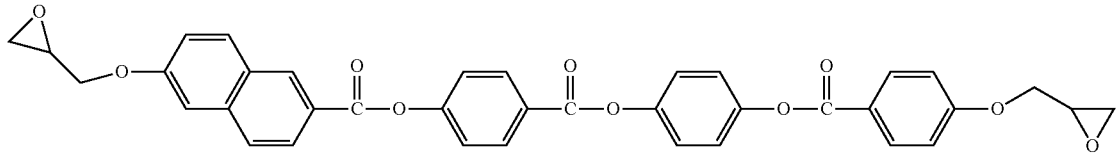

(4-10)

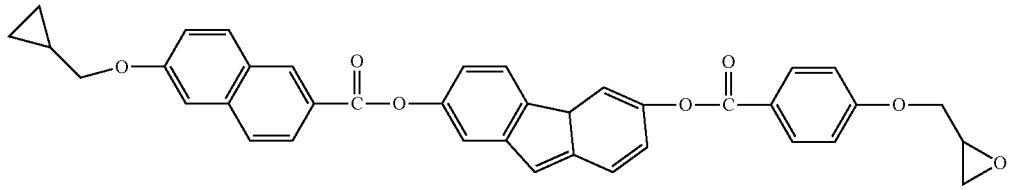

(4-11)

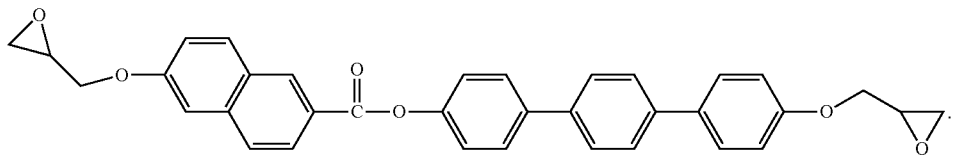

According to an embodiment, the melting temperature of the epoxy compound may be about 190° C. or less, e.g., about 160° to about 190°. Within the above-described range, the epoxy compound may have excellent processability.

According to an embodiment, the thermal conductivity of the epoxy compound may be about 0.4 W/mK or greater, e.g., from 0.4 W/mK to about 50 W/mK, or from 0.4 W/mK to about 30 W/mK, or from 2 W/mK to about 20 W/mK. The epoxy compound has high thermal conductivity in the above-described range, and accordingly, may show high heat dissipating properties and form a composite material having high thermal conductivity. Moreover, the improvement in heat transfer may be obtained even with relatively small amounts of a filler.

According to another embodiment, the epoxy compound is a component of a composition. The composition includes the highly thermally conductive epoxy compound, and may be applied to various electric and electronic fields which require heat dissipating properties as well as a semiconductor.

The composition may further include a filler. The filler may include an inorganic material, an organic material, or combinations thereof.

If the filler includes an inorganic material, the inorganic material r may include at least one of silicon oxide, calcium carbonate, magnesium carbonate, alumina, magnesia, clay, titania, talc, calcium silicate, antimony oxide, glass fiber, or eucryptite ceramic, without limitation. The eucryptite ceramic is a crystallized glass comprising $Li_2O$, $Al_2O_3$, and $SiO_2$ components.

If the filler includes an organic material, the organic material may include at least one of polyethyleneimine, ethylene glycol, or polyethylene glycol, without limitation.

According to an embodiment, the composition may be formed using an inorganic material to improve the heat dissipating properties, mechanical properties, and/or decrease the stress of an epoxy resin composition. The filler may include inorganic fillers used as an encapsulating material of a semiconductor, without limitation, and there are no special limitations.

According to an embodiment, the filler in the composition may be in a range of about 40 parts by weight to about 99 parts by weight based on about 100 parts by weight of the epoxy compound. For example, the filler may be in a range of about 50 parts by weight to about 99 parts by weight, about 60 parts by weight to about 99 parts by weight, about 70 parts by weight to about 95 parts by weight or about 75 parts by weight to about 92 parts by weight based on about 100 parts by weight of the epoxy compound. In the above-described range, desired physical properties such as moldability, low stress, and mechanical strength at a high temperature may be achieved, maintained, or controlled.

The composition may further include at least one additive, for example, a curing agent, a curing accelerator, a reaction controlling agent, a release agent, a coupling agent, a stress relief agent, or an auxiliary flame retardant.

In case of the curing agent, for example, a phenolalkyl-type phenol resin, a phenolnovolac-type phenol resin, a naphthol-type phenol resin, a multi-functional phenol resin, a dicyclopentadiene-based phenol resin, an amine-based curing agent, an acid anhydride-based curing agent, a polyamine curing agent, a polysulfide curing agent, a bisphenol A-type curing agent, a novolac-type phenol resin, an aromatic amine including diaminodiphenylmethane, diaminodiphenylsulfone, and the like may be used, or one or more selected from the above list of curing agents may be used.

The curing agent may be, for example, a multi-functional phenol-based curing agent, and the multi-functional phenol-based curing agent is a compound having three or more phenolic hydroxyl groups and may have a structure below.

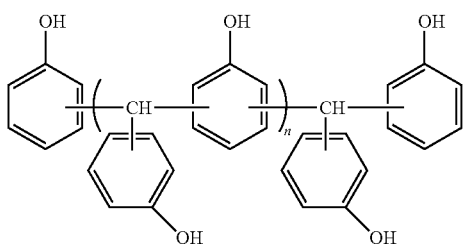

wherein n is an integer of 1 to 10000.

The number average molecular weight of the multi-functional phenol-based curing agent may be, for example, from about 40 grams per mole (g/mol) to about 30,000 g/mol, particularly, for example, from about 60 g/mol to about 10,000 g/mol, more particularly, for example, from about 80 g/mol to about 10,000 g/mol.

The amount of the curing agent present in the composition is not particularly limited but may be from about 0.1 parts by weight to about 10 parts by weight based on about 100 parts by weight of the composition. The deterioration of the insulation properties of a molding material may be prevented, or at least minimized, by increasing a curing rate within the above-described range and by minimizing the amount of an unreacted curing agent.

The composition may further include an epoxy resin in the field of electronic packaging. By further adding an epoxy resin to the composition, a thermal expansion coefficient, warpage and processing properties may be further improved, and peel strength may also be improved.

The epoxy resin may include, for example, a biphenyl epoxy resin, a novolac epoxy resin, a dicyclopentadienyl epoxy resin, a bisphenol epoxy resin, a terpene epoxy resin, an aralkyl epoxy resin, a multi-functional epoxy resin, a naphthalene epoxy resin, or a halogenated epoxy resin, and the like. The above-described epoxy resin may be used alone or by mixing two or more of the listed epoxy resins.

The epoxy resin may be included, for example, in from about 1 part by weight to about 15 parts by weight based on about 100 parts by weight of the composition, without particular limitation. Within the above-described range, the improved effects may include an increase in the adhesive strength between a molding material and a substrate of a semiconductor package, an increase in the thermal expansion coefficient, and/or an increase in the heat dissipating properties of the molding composition.

In an embodiment, a method for preparing the composition is not particularly limited, but the composition may be prepared by a uniform mixing of all components of the composition using a Henschel mixer or a Redige mixer, a melting and kneading process at from about 90° C. to about 120° C. by means of a roll mill or a kneader, a cooling process and a pulverizing process.

A semiconductor package may be formed using the above-described composition.

A printed circuit board on which a semiconductor chip is mounted, may be encapsulated using a molding portion for protecting the semiconductor chip from the exterior environment, providing insulating properties and enabling effective heat dissipation during operation of the chip, to form a semiconductor package. In this case, the molding portion may be formed by applying a molding composition according to an embodiment to the semiconductor chip.

In addition, through solder bumps electrically connecting semiconductor packages formed using the molding composition, the semiconductor packages may be connected above and below to form a semiconductor package with a package-on-package type.

Figure 4:
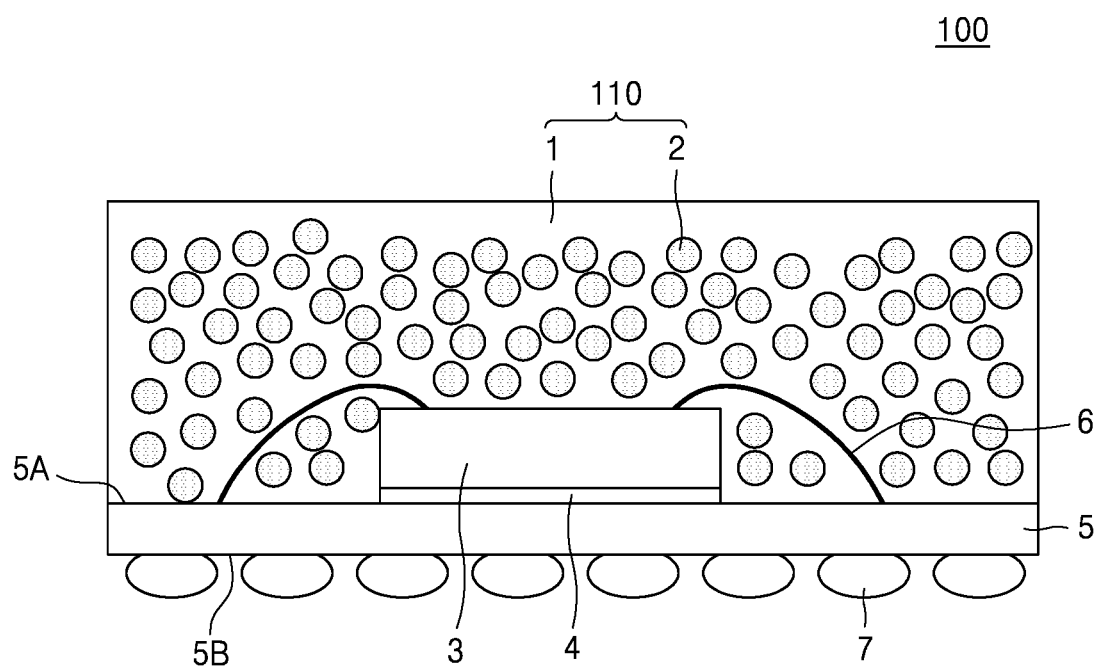
FIG. 4 is a cross-sectional view showing the schematic configuration of a semiconductor package according to an embodiment.

FIG. 4 is a cross-sectional view showing the schematic configuration of a semiconductor package 100 according to an embodiment.

Referring to FIG. 4, a semiconductor package 100 includes a substrate 5, a die attach film 4 positioned on the substrate 5, a chip 3 positioned above the substrate 5 and attached to the substrate 5 through the die attach film 4, a connecting portion 6 such as a bonding wire for electrically interconnecting the chip 3 and the substrate 5, and a molding portion 110 encapsulating the chip 3 and the connecting portion 6 and protecting a mounted structure including the substrate 5, the chip 3 mounted above the substrate 5 and the connecting portion 6.

The molding portion 110 may be applied to completely cover the chip 3 and the connecting portion 6 on the substrate 5.

The molding portion 110 may be obtained from a molding composition for a semiconductor package according to an embodiment described herein. The molding portion 110 includes a molding resin 1, and one or more fillers 2 dispersed in the molding resin 1. The molding portion 110 may have a dispersed shape of fillers in a matrix formed by curing the liquid crystalline epoxy compound.

On the opposite surface 5B of a mounted surface 5A on which the chip 3 is mounted to the substrate 5, a plurality of solder balls 7 for electrically connecting the chip 3 to an exterior circuit (not shown) are present.

In order to manufacture a semiconductor package, for example, a semiconductor package 100 as illustrated in FIG. 4 using the composition, a process for forming a molding portion 110 encapsulating the chip 3 mounted above the substrate 5 may be performed using a low pressure transfer molding process. However, the present inventive concept is not limited thereto, and for example, an injection molding process or a casting process may be used instead of the low pressure transfer molding process.

The composition according to an embodiment may protect a chip region in a semiconductor package from moisture. Accordingly, the reliability of the semiconductor package under relatively humid conditions may be improved.

Figure 5:
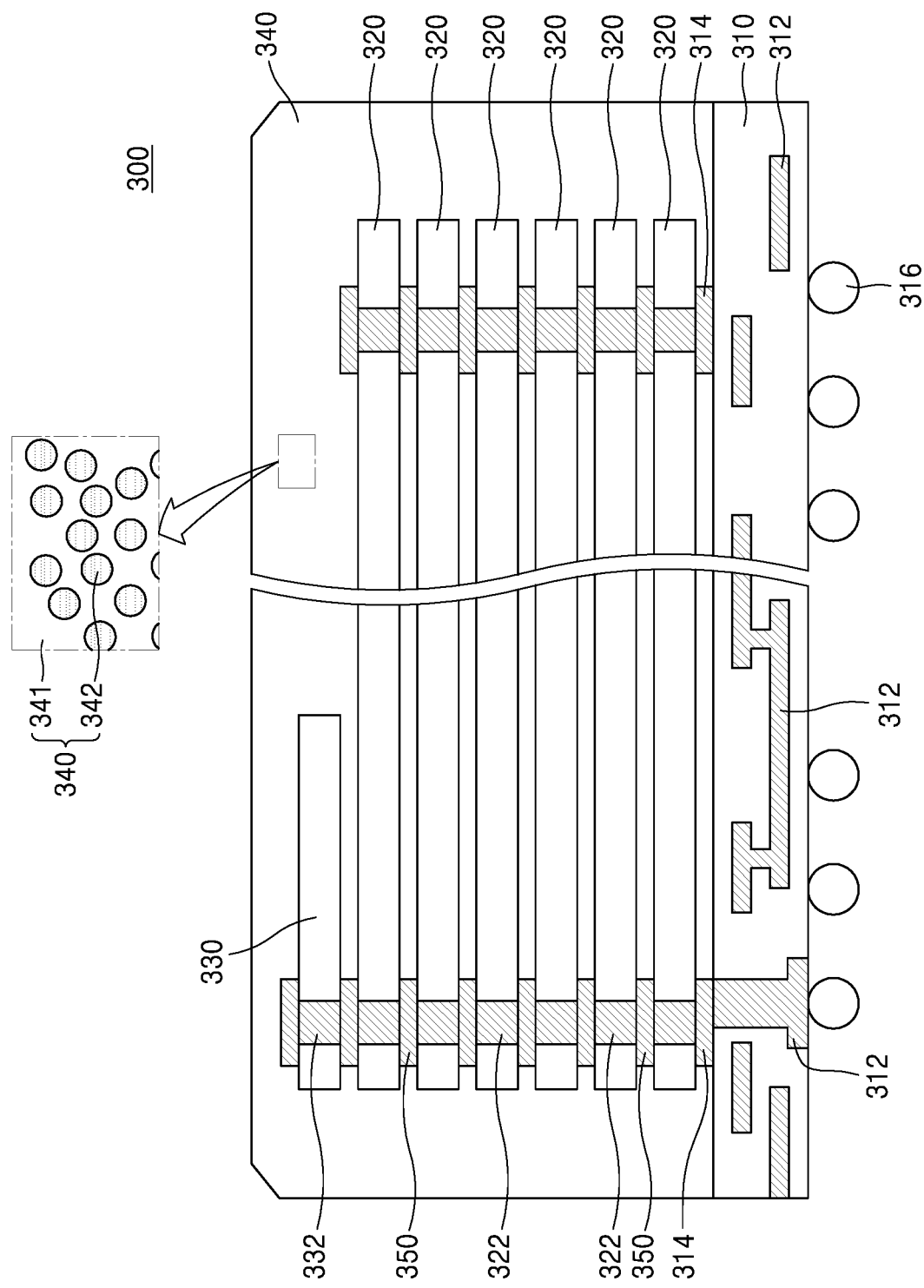
FIG. 5 is a cross-sectional view showing the main elements of an integrated circuit device according to an embodiment.

FIG. 5 is a cross-sectional view showing the main elements of an integrated circuit device 300 according to an embodiment.

Referring to FIG. 5, an integrated circuit device 300 includes a plurality of semiconductor chips 320 stacked on a package substrate 310 and separated by a connecting conductor spacer 350. On the plurality of semiconductor chips 320, a control chip 330 is connected. The stacked structure of the plurality of semiconductor chips 320 and the control chip 330 is encapsulated by a molding portion 340 on a substrate 310. The molding portion 340 may have a similar configuration as explained on the molding portion 110 referring to FIG. 4. The molding portion 340 may be formed using the molding composition for a semiconductor package according to an embodiment. The molding portion 340 includes a molding resin 341, and one or more fillers 342 dispersed in the molding resin 341. The chemistry of the molding resin 341 and the one or more fillers 342 are the same as the molding resin 1 and the one or more fillers 2 of FIG. 4.

In FIG. 5, a stacked structure of six semiconductor chips 320 in a vertical direction is illustrated, but the number and stacking direction of the semiconductor chips 320 are not limited thereto. The number of the semiconductor chips 320 may be determined to more or less than six as necessary. The plurality of semiconductor chips 320 may be arranged in a horizontal direction on the package substrate 310, or arranged in a connected structure obtained by the combination of mounting in a vertical direction and mounting in a horizontal direction. In some embodiments, the control chip 330 may be omitted.

The package substrate 310 may be formed using a flexible printed circuit board, a rigid printed circuit board, or combinations thereof. The package substrate 310 is provided with a substrate internal wiring 312 and a connection terminal 314. The connection terminal 314 may be formed on one side of the package substrate 310. On the other side of the package substrate 310, a solder ball 316 is formed. The connection terminal 314 is electrically connected with the solder ball 316 via the substrate internal wiring 312.

In some embodiments, the solder ball 316 may be replaced with a conductive bump or a lead grid array (LGA).

The plurality of semiconductor chips 320 and the control chip 330 include connection structures 322 and 332, respectively. In some embodiments, the connection structures 322 and 332 may be formed as a through silicon via (TSV) contact structure.

The respective connection structures 322 and 332 of the plurality of semiconductor chips 320 and the control chip 330 may be electrically connected with the connection terminal 314 of the package substrate 310 through the connecting portion 350 such as a bump.

Each of the plurality of the semiconductor chips 320 may include a system LSI, a flash memory, a DRAM, a SRAM, an EEPROM, a PRAM, a MRAM, or a RRAM. The control chip 330 may include logic circuits such as serializer/deserializer (SER/DES) circuits.

Figure 6:
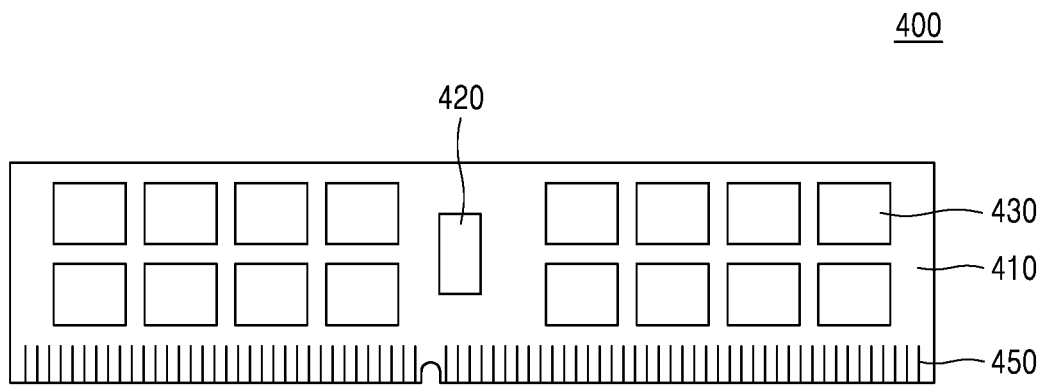
FIG. 6 is a plan view showing the main elements of an integrated circuit device according to an embodiment.

FIG. 6 is a plan view showing the main elements of an integrated circuit device 400 according to an embodiment.

An integrated circuit device 400 includes a module substrate 410, a control chip 420 mounted on the module substrate 410 and a plurality of semiconductor chips 430. On the module substrate 410, a plurality of input and output terminals 450 are formed.

The plurality of semiconductor chips 430 includes at least one of the semiconductor package 100 explained referring to FIG. 4 or the integrated circuit device 300 explained referring to FIG. 5.

Figure 7:
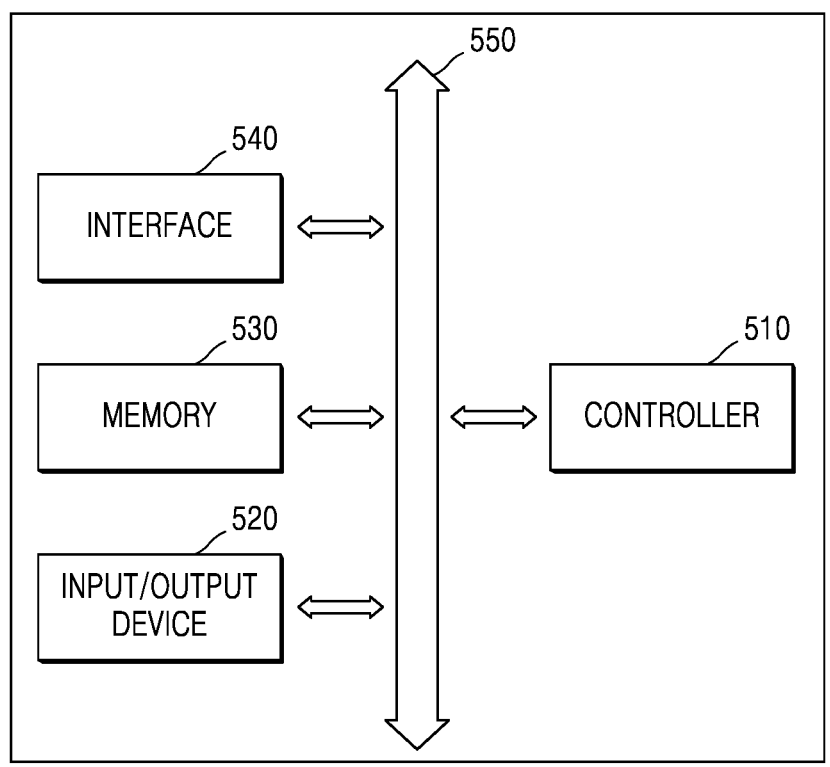
FIG. 7 is a plan view showing the main elements of an integrated circuit device according to embodiments.

FIG. 7 is a diagram showing the main elements of an integrated circuit device 500 according to an embodiment.

The integrated circuit device 500 includes a controller 510, an input/output device 520, a memory 530, and an interface 540. The integrated circuit device 500 may be a mobile system or a system for transmitting or receiving information. In some embodiments, the mobile system may be at least one of a personal digital assistant (PDA), a portable computer, a web tablet, a wireless phone, a mobile phone, a digital music player, or a memory card.

In some embodiments, the controller 510 may be a microprocessor, a digital signal processor, or a micro-controller.

The input/output device 520 is used for inputting and outputting data of the integrated circuit device 500. The integrated circuit device 500 may be connected with an external apparatus, for example, a personal computer or a network and interchange data with the external apparatus using the input/output device 520. In some embodiments, the input/output device 520 may be a keypad, a keyboard, or a display.

In some embodiments, the memory 530 stores codes and/or data for operating the controller 510. In some other embodiments, the memory 530 stores data processed in the controller 510. At least one of the controller 510 and the memory 530 includes at least one of the semiconductor package 100 explained referring to FIG. 4 and the integrated circuit device 300 explained referring to FIG. 5.

The interface 540 plays the role of a data transmission path between the integrated circuit device 500 and other external apparatus. The controller 510, the input/output device 520, the memory 530, and the interface 540 may intercommunicate via a bus 550.

The integrated circuit device 500 may be included in a mobile phone, a MP3 player, a navigation system, a portable multimedia player (PMP), a solid state disk (SSD), or a household appliance.

Figure 8:
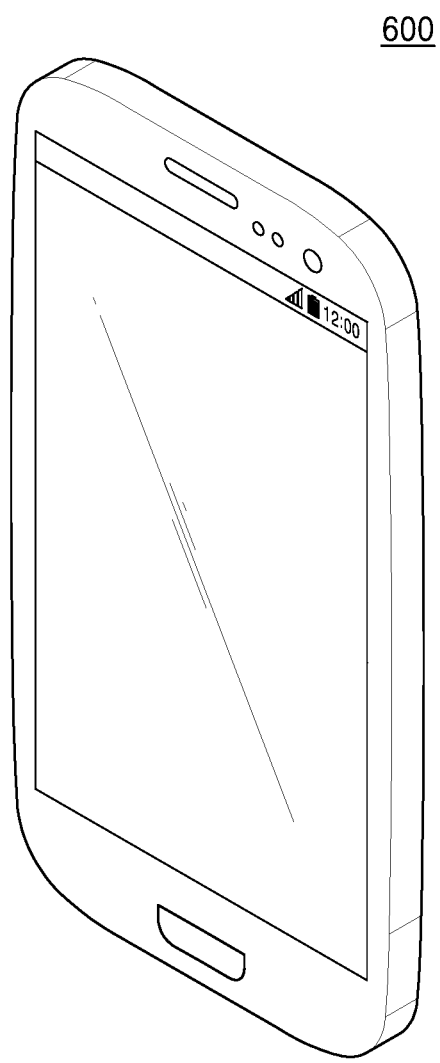
FIG. 8 is a diagram schematically showing a mobile wireless phone according to embodiments.

FIG. 8 is a diagram schematically illustrating a mobile wireless phone 600 according to an embodiment. The mobile wireless phone 600 includes at least one of the semiconductor package 100 explained referring to FIG. 4, the integrated circuit device 300 explained referring to FIG. 5, the integrated circuit device 400 explained referring to FIG. 6, and the integrated circuit device 500 explained referring to FIG. 7.

Meanwhile, the definition of substituents used in the chemical formulae described in the specification will be examined as follows.

The term "alkyl" used in the chemical formulae refers to completely saturated (no carbon-carbon multiple bonds), branched or non-branched (straight chain or linear), substituted or unsubstituted hydrocarbon group.

Non-limiting examples of the "alkyl" may include methyl, ethyl, n-propyl, isopropyl, n-butyl, isobutyl, sec-butyl, n-pentyl, isopentyl, neopentyl, n-hexyl, 3-methylhexyl, 2,2-dimethylpentyl, 2,3-dimethylpentyl, n-heptyl, and the like.

One or more hydrogen atoms in the "alkyl" may be substituted with halogen atoms, halogen atom-substituted alkyl groups of C1-C20 (for example: $CCF_3$, $CHCF_2$, $CH_2F$, $CCl_3$, and the like), alkoxy groups of C1-C20, alkoxyalkyl groups of C2-C20, hydroxyl groups, nitro groups, cyano groups, amino groups, amidino groups, hydrazine groups, hydrazine groups, carboxylic groups or a salt thereof, sulfonyl groups, sulfamoyl groups, sulfonic acid groups or a salt thereof, phosphoric acid groups or a salt thereof, alkyl groups of C1-C20, alkenyl groups of C2-C20, alkynyl groups of C2-C20, heteroalkyl groups of C1-C20, aryl groups of C6-C20, arylalkyl groups of C6-C20, heteroaryl groups of C5-C20, heteroarylalkyl groups of C7-C20, heteroaryloxy groups of C6-C20, heteroaryloxyalkyl groups of C6-C20 or heteroarylalkyl groups of C6-O20.

The term "substitution", e.g., in reference to $R_1$ to $R_{12}$, refers to the substitution of one or more hydrogen atoms with halogen atoms, halogen atom-substituted alkyl groups of C1-08 (for example: $CF_3$, $CHF_2$, $CH_2F$, $CCl_3$, and the like), alkoxy groups of C1-C8, alkoxyalkyl groups of C2-C8, hydroxyl groups, nitro groups, cyano groups, amino groups, amidino groups, hydrazine groups, hydrazone groups, carboxylic groups or a salt thereof, sulfonyl groups, sulfamoyl groups, sulfonic acid groups or a salt thereof, phosphoric acid groups or a salt thereof, alkyl groups of C1-C8, alkenyl groups of C2-C8, alkynyl groups of C2-C8, heteroalkyl groups of C1-C8, aryl groups of C6-C14, arylalkyl groups of C6-C14, heteroaryl groups of C5-C10, heteroarylalkyl groups of C7-C8, heteroaryloxy groups of C6-C10, heteroaryloxyalkyl groups of C6-C10 or heteroarylalkyl groups of C6-C10.

The term "halogen atom" includes fluorine, bromine, chlorine, iodine, and the like.

The term "halogen atom-substituted alkyl group of C1-C20" refers to an alkyl group of C1-C20 in which one or more halo groups are substituted, and non-limiting examples thereof may include monohaloalkyl, dihaloalkyl or polyhaloalkyl including perhaloalkyl.

The monohaloalkyl is a case of having one iodine, bromine, chlorine, or fluorine atom in an alkyl group, and dihaloalkyl and polyhaloalkyl represent an alkyl group having two or more same or different halo atoms.

The term "alkoxy" used in the chemical formulae represents alkyl-O—, and the alkyl is the same as described above. Non-limiting examples of the alkoxy includes methoxy, ethoxy, propoxy, 2-propoxy, butoxy, tert-butoxy, pentyloxy, hexyloxy, cyclopropoxy, cyclohexyloxy, and the like. One or more hydrogen atoms in the alkoxy group may be substituted with the same substituents as in the above-described alkyl group.

The term "alkoxyalkyl" used in the chemical formulae refers to a case where an alkyl group is substituted by the above-described alkoxy. One or more hydrogen atoms in the alkoxyalkyl may be substituted with the same substituents as in the above-described alkyl group. As described above, the term "alkoxyalkyl" includes a substituted alkoxyalkyl moiety.

The term "alkenyl" group used in the chemical formulae refers to a branched or non-branched, substituted or unsubstituted hydrocarbon group having at least one carbon-carbon double bond. Non-limiting examples of the alkenyl group may include vinyl, allyl, butenyl, isopropenyl, isobutenyl, and the like, and one or more hydrogen atoms in the alkenyl group may be substituted with the same substituents as in the above-described alkyl group.

The term "alkynyl" group used in chemical formulae refers to branched or non-branched, substituted or unsubstituted hydrocarbon group having at least one carbon-carbon triple bond. Non-limiting examples of the "alkynyl" may include ethynyl, butynyl, isobutynyl, isopropynyl, and the like.

One or more hydrogen atoms in the "alkynyl" may be substituted with the same substituents as in the above-described alkyl group.

The term "aryl" group used in the chemical formulae is used alone or in combination, and means a substituted or unsubstituted aromatic hydrocarbon group including one or more rings.

The term "aryl" also includes a fused group of an aromatic ring to one or more cycloalkyl rings.

Non-limiting examples of the "aryl" include phenyl, naphthyl, tetrahydronaphthyl, and the like.

In addition, one or more hydrogen atoms in the "aryl" group may also be substituted with the same substituents as in the above-described alkyl group.

The term "arylalkyl" means aryl-substituted alkyl. Examples of the arylalkyl may include benzyl- or phenyl-$CH_2CH_2$—.

The term "aryloxy" used in the chemical formulae means —O-aryl, and examples of the aryloxy group include phenoxy, and the like. One or more hydrogen atoms in the "aryloxy" group may also be substituted with the same substituents as in the above-described alkyl group.

The term "heteroaryl" group used in the chemical formulae means a monocyclic or bicyclic aromatic organic group including one or more heteroatoms that may be N, O, P or S, and remaining ring-forming carbon atoms. The heteroaryl group may include, for example, 1 to 5 heteroatoms and 5 to 10 ring members. S or N may be oxidized to have various oxidation states.

The monocyclic heteroaryl group may include thienyl, pyrrolyl, imidazolyl, pyrazolyl, thiazolyl, isothiazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, isothiazol-3-yl, isothiazol-4-yl, isothiazol-5-yl, oxazol-2-yl, oxazol-4-yl, oxazol-5-yl, isooxazol-3-yl, isooxazol-4-yl, isooxazol-5-yl, 1,2,4-triazol-3-yl, 1,2,4-triazol-5-yl, 1,2,3-triazol-4-yl, 1,2,3-triazol-5-yl, tetrazolyl, pyrid-2-yl, pyrid-3-yl, pyrazine-2-yl, pyrazine-4-yl, pyrazine-5-yl, pyrimidine-2-yl, pyrimidine-4-yl, or pyrimidine-5-yl.

The term heteroaryl includes a case where a heteroaromatic ring is fused to one or more aryl, cycloaliphatic, or heterocycles.

Examples of the bicyclic heteroaryl may include indolyl, isoindolyl, indazolyl, indolizinyl, purinyl, quinolizinyl, quinolinyl, isoquinolinyl, cinnolinyl, phthalazinyl, naphthyridinyl, quinazolinyl, quinoxalinyl, phenanthridinyl, phenathrolinyl, phenazinyl, phenothiazinyl, phenoxazinyl, benzisoqinolinyl, thieno[2,3-b]furanyl, furo[3,2-b]-pyranyl, 5H-pyrido[2,3-d]-o-oxazinyl, 1H-pyrazolo[4,3-d]-oxazolyl, 4H-imidazo[4,5-d]thiazolyl, pyrazino[2,3-d]pyridazinyl, imidazo[2,1-b]thiazolyl, imidazo[1,2-b][1,2,4]triazinyl, 7-benzo[b]thienyl, benzoxazolyl, benzimidazolyl, benzothiazolyl, benzoxazepinyl, benzoxazinyl, 1H-pyrrolo[1,2-b][2]benzazapinyl, benzofuryl, benzothiophenyl, benzotriazolyl, pyrrolo[2,3-b]pyridinyl, pyrrolo[3,2-c]pyridinyl, pyrrolo[3,2-b]pyridinyl, imidazo[4,5-b]pyridinyl, imidazo[4,5-c]pyridinyl, pyrazolo[4,3-d]pyridinyl, pyrazolo[4,3-c]pyridinyl, pyrazolo[3,4-c]pyridinyl, pyrazolo[3,4-d]pyridinyl, pyrazolo[3,4-b]pyridinyl, imidazo[1,2-a]pyridinyl, pyrazolo[1,5-a]pyridinyl, pyrrolo[1,2-b]pyridazinyl, imidazo[1,2-c]pyrimidinyl, pyrido[3,2-d]pyrimidinyl, pyrido[4,3-d]pyrimidinyl, pyrido[3,4-d]pyrimidinyl, pyrido[2,3-d]pyrimidinyl, pyrido[2,3-b]pyrazinyl, pyrido[3,4-b]pyrazinyl, pyrimido[5,4-d]pyrimidinyl, pyrazino[2,3-b]pyrazinyl, or pyrimido[4,5-d]pyrimidinyl.

One or more hydrogen atoms in the "heteroaryl" may also be substituted with the same substituents as in the above-described alkyl group.

The term "heteroarylalkyl" means heteroaryl-substituted alkyl.

The term "heteroaryloxy" means a —O-heteroaryl moiety. One or more hydrogen atoms in the heteroaryloxy may also be substituted with the same substituents as in the above-described alkyl group.

The term "heteroaryloxyalkyl" means heteroaryloxy-substituted alkyl. One or more hydrogen atoms in the heteroaryloxyalkyl may also be substituted with the same substituents as in the above-described alkyl group.

"Carbon ring" used in the chemical formulae includes a saturated or partially unsaturated non-aromatic monocyclic, bicyclic or tricyclic hydrocarbon group.

Examples of the monocyclic hydrocarbon group include cyclopentyl, cyclopentenyl, cyclohexyl, cyclohexenyl, and the like.

Examples of the bicyclic hydrocarbon group include bornyl, decahydronaphthyl, bicyclo[2.1.1]hexyl, bicyclo[2.2.1]heptyl, bicyclo[2.2.1]-heptenyl, or bicyclo[2.2.2]octyl.

Examples of the tricyclic hydrocarbon group include adamantyl, and the like.

One or more hydrogen atoms in the "carbon ring" may also be substituted with the same substituents as in the above-described alkyl group.

"Heterocyclic" group used in chemical formulae refers to a ring group composed of 5 to 10 atoms and containing a heteroatom such as nitrogen, sulfur, phosphorus and oxygen, and includes pyridyl as a particular example, and one or more hydrogen atoms in the heterocyclic group may also be substituted as in the above-described alkyl group.

The term "heterocyclicoxy" means —O-heterocycle, and one or more hydrogen atoms in the heterocyclicoxy group may also be substituted as in the above-described alkyl group.

The term "sulfonyl" means R"—SO$_2$—, and R" is hydrogen, alkyl, aryl, heteroaryl, aryl-alkyl, heteroaryl-alkyl, alkoxy, aryloxy, a cycloalkyl group or a heterocyclic group.

The term "sulfamoyl" group includes H$_2$NS(O$_2$)—, alkyl-NHS(O$_2$)—, (alkyl)$_2$NS(O$_2$)— aryl-NHS(O$_2$)—, alkyl-(aryl)-NS(O$_2$)—, (aryl)$_2$NS(O)$_2$, heteroaryl-NHS(O$_2$)—, (aryl-alkyl)-NHS(O$_2$)—, or (heteroaryl-alkyl)-NHS(O$_2$)—.

One or more hydrogen atoms in the sulfamoyl may also be substituted as in the above-described alkyl group.

The term "amino group" represents a case where a nitrogen atom makes a covalent bond with at least one carbon or heteroatom. The amino group includes, for example, —NH$_2$ and a substituted moiety. In addition, included are "alkylamino" in which a nitrogen atom is bonded to at least one additional alkyl group, and "arylamino" and "diarylamino", in which nitrogen atoms are independently bonded to one or two selected aryl groups.

Alkylene, arylene and heteroarylene mean divalent groups obtained from an alkyl, aryl and heteroaryl group, respectively.

Hereinafter, example embodiments will be explained in more detail referring to examples and comparative examples. However, the examples are only for illustrating technical spirits, and the scope of the disclosure is not limited thereto.

EXAMPLE 1

(1) Preparation of Epoxy Compound

An epoxy compound of Formula (4-1) was prepared by the preparation process below.

To a 500 milliliter (ml) glass reactor, ethyl-4-hydroxybenzoate (0.2 mol, 33.2 grams (g)), 3-bromopropene (0.25 mol, 30.3 g), K$_2$CO$_3$ (0.3 mol, 42.0 g), and acetone (300 ml) were added. After sufficiently exchanging the interior of the reactor with nitrogen gas, the reactants were refluxed for 24 hours under a nitrogen gas stream. After adding diethyl ether (150 ml) and water (100 ml), a diethyl ether layer was washed three times with a NaOH 10% solution (100 ml). Diethyl ether was evaporated, and a 2N HCl solution was added until the pH reached 2. The reaction product was washed with cool water and recrystallized with ethanol to prepare a compound represented by Chemical Formula 4-1-1 below.

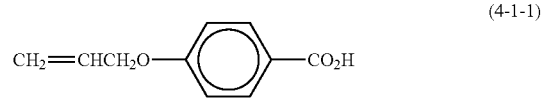

(4-1-1)

The compound of Chemical Formula 4-1-1 (0.033 mol, 6.6 g) and SOCl$_2$ (0.13 mol, 9.7 ml) were refluxed for 2 hours. After removal of excess SOCl$_2$ under vacuo, pyridine (30 ml) was added. 2,6-naphthalenediol (0.017 mol, 2.7 g) was added, and the reaction mixture was cooled in an ice bath for 2 hours and then, at room temperature for 24 hours. A 2N HCl solution (500 ml) was added, and then, the resultant solution was washed with a Na$_2$CO$_3$ aqueous solution (300 ml) and water (300 ml), and recrystallized with ethyl acetate to prepare a compound represented by Chemical Formula 4-1-2 below.

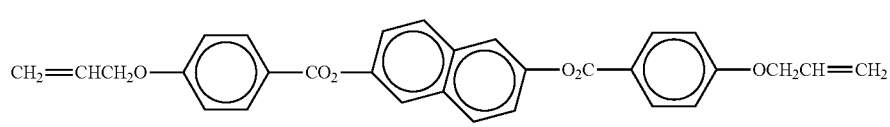

(4-1-2)

The compound of Chemical Formula 4-1-2 (0.010 mol, 5.4 g), 75% 3-chloroperoxybenzoic acid (0.027 mol, 6.2 g), and dichloromethane (200 ml) were refluxed for 4 days. The reaction product was filtered and washed with a 5% Na$_2$SO$_3$ aqueous solution (200 ml), a 5% Na$_2$CO$_3$ aqueous solution (200 ml), and a NaCl aqueous solution (200 ml) in order, dichloromethane was evaporated, and the resultant product was recrystallized with ethyl acetate to prepare the compound represented by Formula 4-1.

(2) Formation of Composite

To a dichloromethane/acetone mixture solvent, the epoxy resin thus prepared and 0.45 mol of diaminodiphenylsulfone

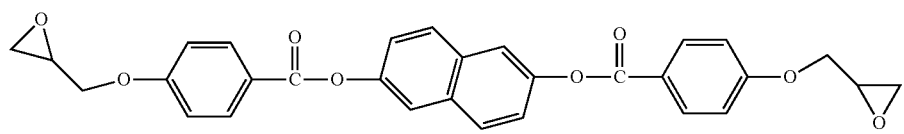

(4-1)

(DDS) as a curing agent based on the epoxy resin were added, followed by stirring at about 300 rpm and dissolving at room temperature (25° C.) to prepare a mixture. The mixture was put into a container having a thickness of 10 mm and a diameter of 40 mm, and solvents were evaporated in a vacuum oven at room temperature.

Then, a first curing was performed at 200° C. for 6 hours, and a second curing was performed at 240° C. for 4 hours to prepare a completely cured composite, that is, an epoxy cured compound specimen having a thickness of 3 mm and a diameter of 20 mm.

EXAMPLE 2

(1) Preparation of Epoxy Compound

An epoxy compound of Formula (4-2) was prepared by the preparation process below.

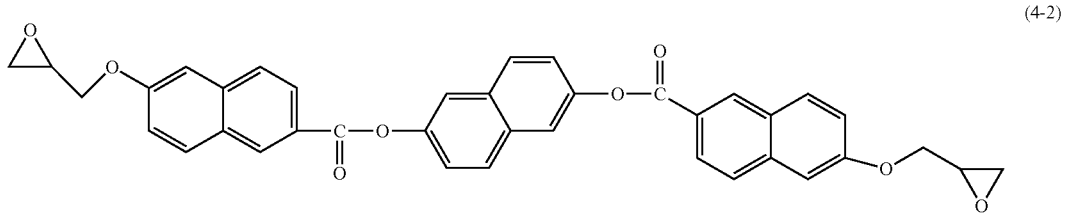 [SMILES: O=C(Oc1ccc2cc(OC(=O)c3ccc4cc(OCC5CO5)ccc4c3)ccc2c1)c1ccc2cc(OCC3CO3)ccc2c1]

(4-2)

To a 150 ml glass reactor, 2,6-naphthalenedicarboxylic acid (0.2 mol, 37.6 g), 2,6-dihydroxynaphthalene (0.1 mol, 16.0 g), sulfolane (50 ml) and p-TSA (p-Toluenesulfonic acid) (5 mmol, 0.9 g) were added. After sufficiently exchanging the interior of the reactor with nitrogen gas, the temperature in the reactor was elevated to 180° C. under a nitrogen gas stream, and while maintaining the inner temperature of the reactor, the reactants were refluxed for 4 hours. The reaction product was washed with cool water and ethanol to prepare a compound represented by Chemical Formula 4-2-1 below.

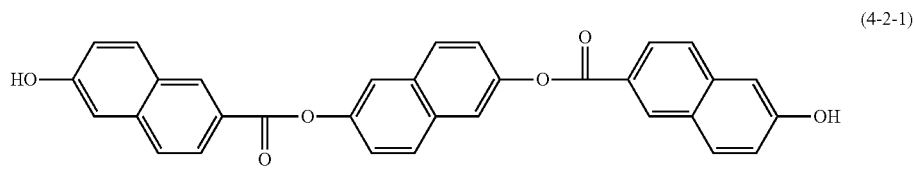 [SMILES: O=C(Oc1ccc2cc(OC(=O)c3ccc4cc(O)ccc4c3)ccc2c1)c1ccc2cc(O)ccc2c1]

(4-2-1)

To a 150 ml glass reactor, the compound represented by Chemical Formula 4-2-1 (10.5 mmol, 5.1 g), epichlorohydrin (0.42 mol, 39.2 g), and isopropyl alcohol (0.32 mol, 19.1 g) were added. After sufficiently exchanging the interior of the reactor with nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added to the reactor dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-2.

(2) Formation of Composite

A composite was prepared by performing the same procedure in Example 1 except for using the epoxy compound of Formula (4-2).

EXAMPLE 3

(1) Preparation of Epoxy Compound

An epoxy compound of Formula (4-3) was prepared by the preparation process below.

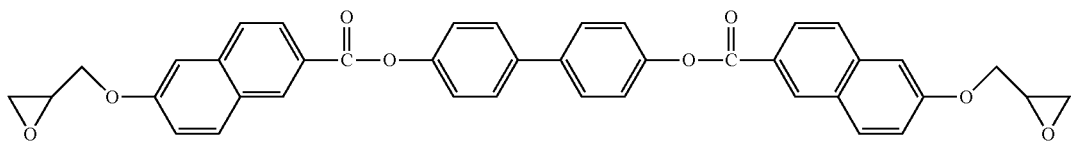 [SMILES: O=C(Oc1ccc(-c2ccc(OC(=O)c3ccc4cc(OCC5CO5)ccc4c3)cc2)cc1)c1ccc2cc(OCC3CO3)ccc2c1]
(4-3)

To a 150 ml glass reactor, 6-hydroxy-2-naphthoic acid (0.2 mol, 37.6 g), 4,4'-biphenol (0.1 mol, 18.6 g), sulfolane (50 ml), and p-TSA (5 mmol, 0.9 g) were added. After sufficiently exchanging the interior of the reactor with nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-3-1 below.

To a 500 ml glass reactor, 4-hydroxybenzoic acid (0.1 mol, 13.8 g), and hydroquinone (0.9 mol, 99.0 g) were added, the interior of the reactor was sufficiently exchanged with nitrogen gas, the temperature in the reactor was elevated to 260° C. under a nitrogen gas stream, and the reaction was performed for 2.5 hours. Water (1000 ml) was added, filtering was performed to obtain a reaction product, and recrystallization was performed using ethanol and water to prepare a compound represented by Chemical Formula 4-4-1 below.

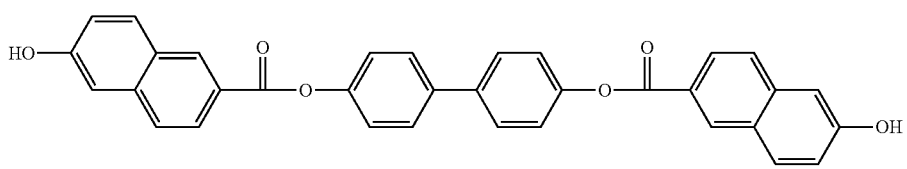
(4-3-1)

To a 150 ml glass reactor, the compound represented by Chemical Formula 4-3-1 (10.5 mmol, 5.1 g), epichlorohydrin (0.42 mol, 39.2 g), and isopropyl alcohol (0.32 mol, 19.1 g) were added. After sufficiently exchanging the interior of the reactor with nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added to the reactor dropwise over 1 hour. The temperature of the reactor was elevated to 60° C., and stirring was performed for 4 hours. The temperature of the reactor was decreased to room temperature and recrystallization was performed using $CH_2Cl_2/CH_3OH$ to prepare the compound represented by Chemical Formula 4-3.

(2) Formation of Composite

A composite was prepared by performing the same procedure in Example 1 except for using the epoxy compound of Formula (4-3).

EXAMPLE 4

(1) Preparation of Epoxy Compound

An epoxy compound of Formula (4-4) was prepared by the preparation process below.

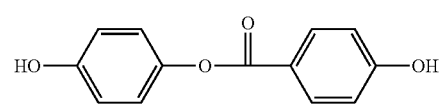
(4-4-1)

To a 150 ml glass reactor, the compound represented by Chemical Formula 4-4-1 (0.1 mol, 23 g), 6-hydroxy-2-naphthoic acid (0.2 mol, 37.6 g), p-xylene (120 ml), and p-TSA (5 mmol, 0.9 g) were added. After sufficiently exchanging the interior of the reactor with nitrogen gas, the temperature in the reactor was elevated to a temperature of 150° C. under a nitrogen gas stream, and while maintaining the inner temperature of the reactor, the reactants were refluxed for 48 hours. The reaction product was filtered and washed with water to prepare a compound represented by Chemical Formula 4-4-2 below.

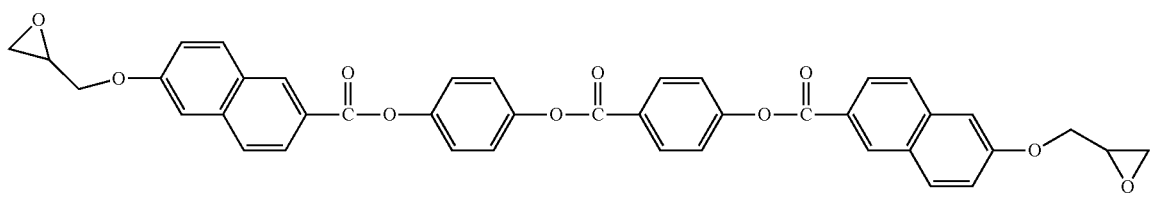 [SMILES: O=C(Oc1ccc(OC(=O)c2ccc3cc(OCC4CO4)ccc3c2)cc1)c1ccc(OC(=O)c2ccc3cc(OCC4CO4)ccc3c2)cc1]
(4-4)

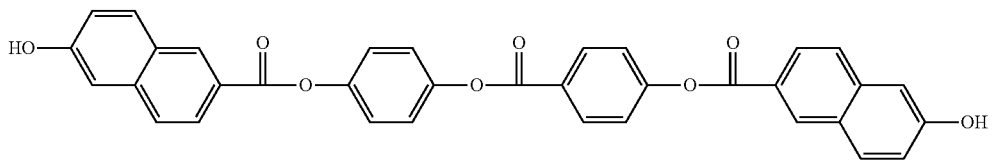

(4-4-2)

To a 150 ml glass reactor, the compound represented by Chemical Formula 4-4-2 (10.5 mmol), epichlorohydrin (0.42 mol), and isopropyl alcohol (0.32 mol) were added. After sufficiently exchanging the interior of the reactor with nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-4.

(2) Formation of Composite

A composite was prepared by performing the same procedure in Example 1 except for using the epoxy compound of Formula (4-4).

EXAMPLE 5

(1) Preparation of Epoxy Compound

An epoxy compound of Formula (4-5) was prepared by the preparation process below.

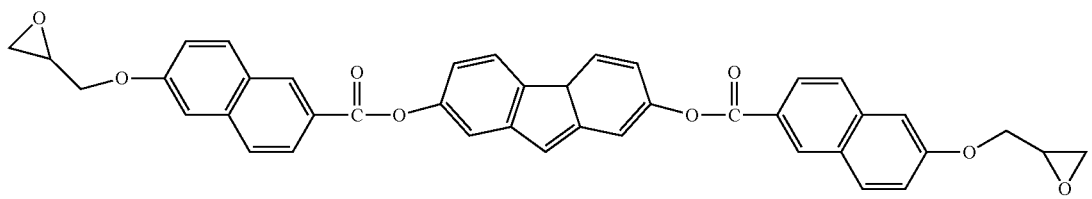 [SMILES: O=C(OC1=CC2=Cc3cc(OC(=O)c4ccc5cc(OCC6CO6)ccc5c4)ccc3C2C=C1)c1ccc2cc(OCC3CO3)ccc2c1]

(4-5)

To a 150 ml glass reactor, 6-hydroxy-2-naphthoic acid (0.2 mol, 37.6 g), 2,7-dihydroxyfluorene (0.1 mol, 19.8 g), sulfolane (50 ml), and p-TSA (5 mmol, 0.9 g) were added. After sufficiently exchanging the interior of the reactor with nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-5-1 below.

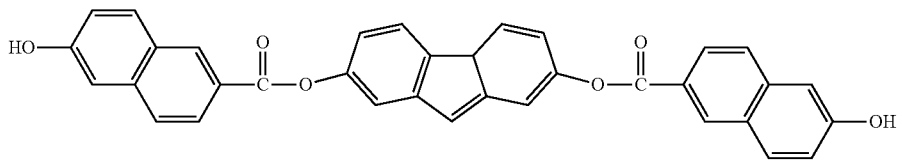

(4-5-1)

To a 150 ml glass reactor, the compound represented by Chemical Formula 4-5-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-5.

(2) Formation of Composite

A composite was prepared by performing the same procedure in Example 1 except for using the epoxy compound of Formula (4-5).

EXAMPLE 6

(1) Preparation of Epoxy Compound

An epoxy compound of Formula (4-6) was prepared by the preparation process below.

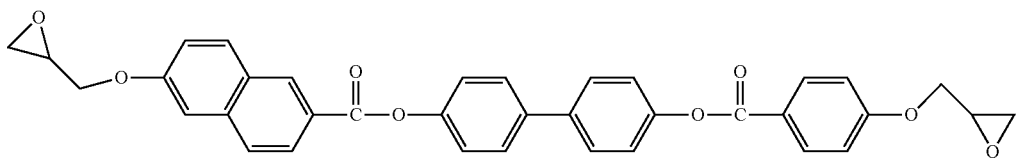 [SMILES: O=C(Oc1ccc(-c2ccc(OC(=O)c3ccc4cc(OCC5CO5)ccc4c3)cc2)cc1)c1ccc(OCC2CO2)cc1]

(4-6)

To a 150 ml glass reactor, 6-hydroxy-2-naphthoic acid (0.1 mol, 18.8 g), 4-hydroxybenzoic acid (0.1 mol, 13.8 g), 4,4'-biphenol (0.1 mol, 18.6 g), sulfolane (50 ml), and p-TSA (5 mmol, 0.9 g) were added. After sufficiently exchanging the interior of the reactor with a nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-6-1 below.

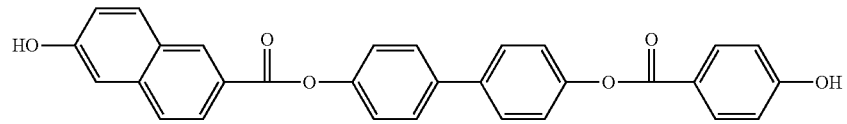

(4-6-1)

To a 150 ml glass reactor, the compound represented by Chemical Formula 4-6-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-6.

(2) Formation of Composite

A composite was prepared by performing the same procedure in Example 1 except for using the epoxy compound of Formula (4-6).

EXAMPLE 7

(1) Preparation of Epoxy Compound

An epoxy compound of Formula (4-7) was prepared by the preparation process below.

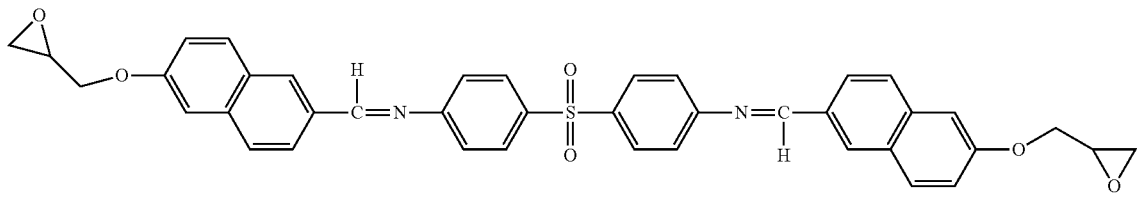 [SMILES: O=S(=O)(c1ccc(N=Cc2ccc3cc(OCC4CO4)ccc3c2)cc1)c1ccc(N=Cc2ccc3cc(OCC4CO4)ccc3c2)cc1]

(4-7)

To a 150 ml glass reactor, 6-hydroxy-2-naphthaldehyde (0.2 mol, 34.4 g), 4,4'-diaminodiphenyl sulfone (0.1 mol, 24.8 g), ethanol (100 ml), and p-TSA (5 mmol, 0.9 g) were added. After sufficiently exchanging the interior of the reactor with a nitrogen gas, the reactants were refluxed for 24 hours. The reaction product was washed with ethanol to prepare a compound represented by Chemical Formula 4-7-1 below.

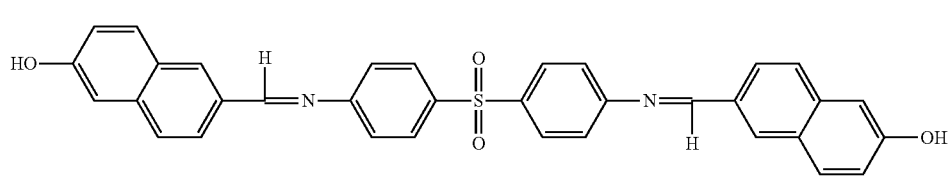

(4-7-1)

To a 150 ml glass reactor, the compound represented by Chemical Formula 4-7-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-7.

(2) Formation of Composite

A composite was prepared by performing the same procedure in Example 1 except for using the epoxy compound of Formula (4-7).

EXAMPLE 8

(1) Preparation of Epoxy Compound

An epoxy compound of Formula (4-8) was prepared by the preparation process below.

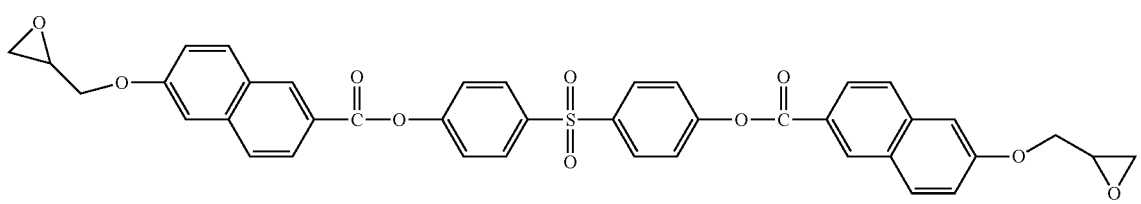

(4-8)

To a 150 ml glass reactor, 6-hydroxy-2-naphthoic acid (0.2 mol, 37.6 g), 4,4'-sulfonyldiphenol (0.1 mol, 25.3 g), sulfolane (50 ml), and p-TSA (5 mmol, 0.9 g) were added. After sufficiently exchanging the interior of the reactor with a nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-8-1 below.

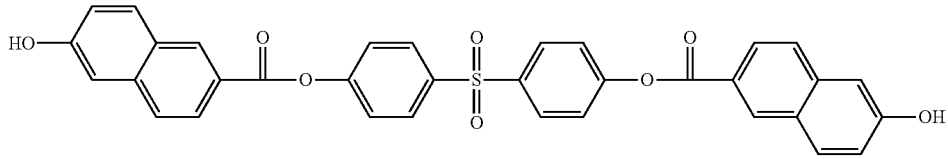

(4-8-1)

To a 150 ml glass reactor, the compound represented by Chemical Formula 4-8-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-8.

(2) Formation of Composite

A composite was prepared by performing the same procedure in Example 1 except for using the epoxy compound of Formula (4-8).

EXAMPLE 9

(1) Preparation of Epoxy Compound

An epoxy compound of Formula (4-9) was prepared by the preparation process below.

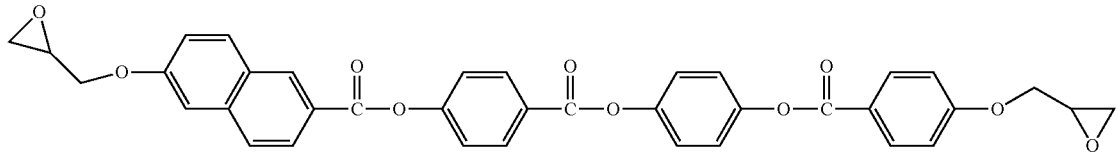

(4-9)

To a 150 ml glass reactor, 6-hydroxy-2-naphthoic acid (0.1 mol, 18.8 g), 4-hydroxybenzoic acid (0.1 mol, 13.8 g), the compound represented by 4-4-1 (0.1 mol, 23 g), sulfolane (50 ml), and p-TSA (5 mmol, 0.9 g) were added. After sufficiently exchanging the interior of the reactor with a nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-9-1 below.

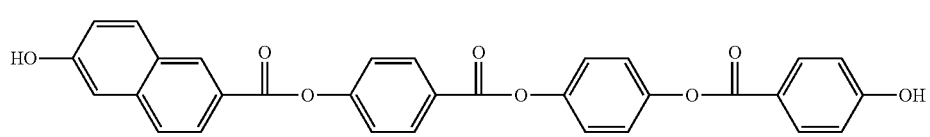

(4-9-1)

To a 150 ml glass reactor, the compound represented by Chemical Formula 4-9-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-9.

(2) Formation of Composite

A composite was prepared by performing the same procedure in Example 1 except for using the epoxy compound of Formula (4-9).

EXAMPLE 10

(1) Preparation of Epoxy Compound

An epoxy compound of Formula (4-10) was prepared by the preparation process below.

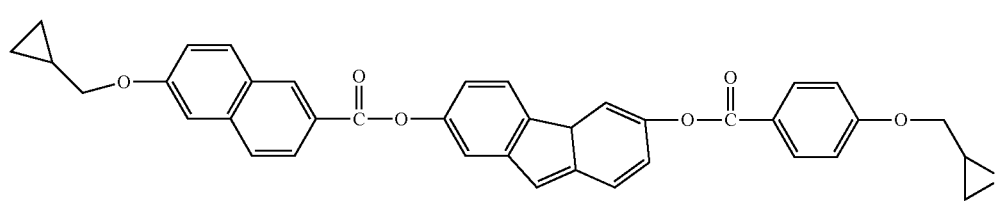

(4-10)

To a 150 ml glass reactor, 6-hydroxy-2-naphthoic acid (0.1 mol, 18.8 g), 4-hydroxybenzoic acid (0.1 mol, 13.8 g), 2,7-dihydroxyfluorene (0.1 mol, 19.8 g), sulfolane (50 ml) and p-TSA (5 mmol, 0.9 g) were added. After sufficiently exchanging the interior of the reactor with a nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-10-1 below.

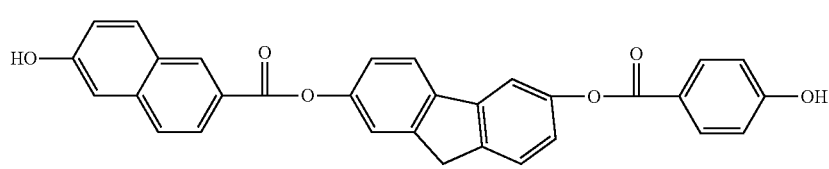

(4-10-1)

To a 150 ml glass reactor, the compound represented by Chemical Formula 4-10-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-10.

(2) Formation of Composite

A composite was prepared by performing the same procedure in Example 1 except for using the epoxy compound of Formula (4-10).

EXAMPLE 11

(1) Preparation of Epoxy Compound

An epoxy compound of Formula (4-11) was prepared by the preparation process below.

(2) Formation of Composite

A composite was prepared by performing the same procedure in Example 1 except for using the epoxy compound of Formula (4-11).

Comparative Example 1

(1) Preparation of Epoxy Compound

As an epoxy compound, NC-3000, a product of Nippon Kayaku Co. was used. The epoxy compound has the structure below.

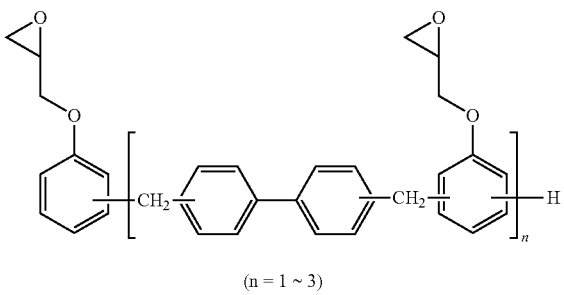

(n = 1 ~ 3)

(4-11)

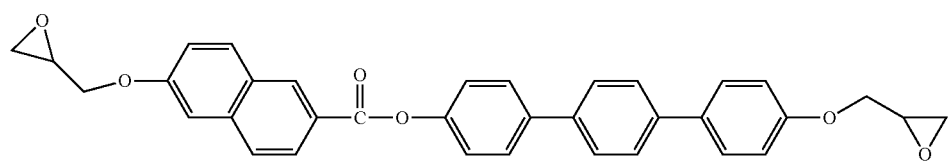 [SMILES: O=C(Oc1ccc(-c2ccc(-c3ccc(OCC4CO4)cc3)cc2)cc1)c1ccc2cc(OCC3CO3)ccc2c1]

To a 150 ml glass reactor, 6-hydroxy-2-naphthoic acid (0.1 mol, 18.8 g), 1,1:4,1-terphenyl-4,4-diol (0.1 mol, 26.2 g), sulfolane (50 ml), and p-TSA (5 mmol, 0.9 g) were added. After sufficiently exchanging the interior of the reactor with a nitrogen gas, the temperature in the reactor was elevated to a temperature of 180° C. under a nitrogen gas stream, and while maintaining the inner temperature of the reactor, the reactants were refluxed for 4 hours. The reaction product was washed with cool water and ethanol to prepare a compound represented by Chemical Formula 4-11-1 below.

(4-11-1)

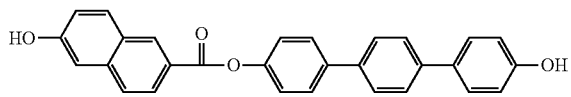

To a 150 ml glass reactor, the compound represented by Chemical Formula 4-11-1 (10.5 mmol), and epichlorohydrin (0.42 mol) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using $CH_2Cl_2/CH_3OH$ to prepare the compound represented by Chemical Formula 4-11.

(2) Formation of Composite 10 g of the epoxy compound, 3.5 g of a curing agent, MEH7500 (Myungsung Chemical Co., multi-functional phenol) and 0.01 g of triphenylphosphine (TPP) were injected into a hot-press molding container and cured in conditions of 170° C., 2 hours and 5 MPa to form a composite with a disk shape having a thickness of 3 mm and a diameter of 20 mm.

Comparative Example 2

(1) Preparation of Epoxy Compound

An epoxy compound having a formula below was prepared by the preparation process below.

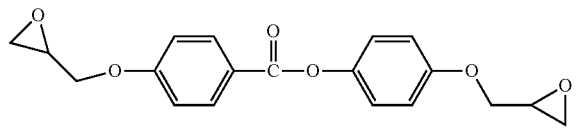 [SMILES: O=C(Oc1ccc(OCC2CO2)cc1)c1ccc(OCC2CO2)cc1]

To a 150 ml glass reactor, the compound represented by Chemical Formula 4-4-1 (5.66 g), epichlorohydrin (50 ml), N-butyl-N,N-dipropylbutan-1-aminium bromide (TBAB, 0.12 g), and methanol (30 ml) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using CH$_2$Cl$_2$/CH$_3$OH to prepare the compound of the above formula.

(2) Formation of Composite

A composite was prepared by performing the same procedure in Example 1 except for using the epoxy compound prepared above.

Comparative Example 3

(1) Preparation of Epoxy Compound

An epoxy compound having a formula below was prepared by the preparation process below.

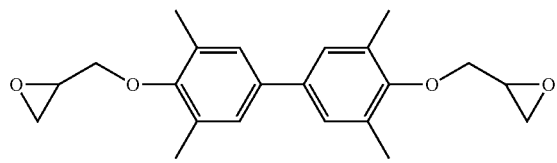 [SMILES: Cc1cc(-c2cc(C)c(OCC3CO3)c(C)c2)cc(C)c1OCC1CO1]

To a 150 ml glass reactor, 3,3',5,5'-tetramethyl[1,1'-biphenyl]-4,4'-diol (5.7 g), epichlorohydrin (50 ml), N-butyl-N,N-dipropylbutan-1-aminium bromide (TBAB, 0.12 g), and methanol (30 ml) were added. After sufficiently exchanging the interior of the reactor with a nitrogen gas, the temperature in the reactor was elevated to a temperature of 50° C. under a nitrogen gas stream, and while maintaining the inner temperature of the reactor, the reactants were refluxed for 5 hours. The temperature in the reactor was decreased to room temperature, and a NaOH solution (30% by weight, 8.5 ml) was added thereto dropwise over 1 hour. The temperature of the reactor was elevated to 60° C., and stirring was performed for 4 hours. The temperature of the reactor was decreased to room temperature, and recrystallization was performed using CH$_2$Cl$_2$/CH$_3$OH to prepare the compound.

(2) Formation of Composite

A composite was prepared by performing the same procedure in Example 1 except for using the epoxy compound prepared above.

Evaluation Example 1: Evaluation of Physical Properties

Thermal conductivity was evaluated for the epoxy compounds prepared in Examples 1 to 11 and Comparative Examples 1 to 3 using a thermal conductivity measurement apparatus (Model name TCi) of Scinco Co., and the results are shown in Table 1 below.

TABLE 1

| | Epoxy compound structure | Thermal cond. (W/mK) |
|---|---|---|
| Example 1 | | 0.44 |
| Example 2 | | 0.60 |
| Example 3 | | 0.64 |
| Example 4 | | 0.52 |
| Example 5 | | 0.48 |

TABLE 1-continued

| | Epoxy compound structure | Thermal cond. (W/mK) |
|---|---|---|
| Example 6 | | 0.55 |
| Example 7 | | 0.59 |
| Example 8 | | 0.55 |
| Example 9 | | 0.68 |
| Example 10 | | 0.59 |
| Example 11 | | 0.48 |
| Comparative Example 1 | | 0.21 |
| Comparative Example 2 | | 0.31 |

TABLE 1-continued

| | Epoxy compound structure | Thermal cond. (W/mK) |
|---|---|---|
| Comparative Example 3 | 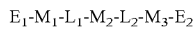 | 0.33 |

As shown in Table 1 above, the thermal conductivity of the common commercial epoxy compounds (Comparative Examples 1, 2 and 3), in which a naphthalene structure was not included in a mesogenic unit was about 0.21 watts per meter·Kelvin (W/mK) to 0.33 W/mK. In contrast, the epoxy compounds prepared according to Examples 1 to 11, in which one to three naphthalene units were included in a mesogenic unit demonstrated thermal conductivity values of about 0.4 W/m K or greater. In particular, a high thermal conductivity value of about 0.64 W/mK could be obtained in a case where a biphenyl group was positioned at the center of a mesogenic unit, and naphthalene units positioned at both terminal ends of the mesogenic unit.

In addition, it could be found that the epoxy compounds prepared in Examples 1 to 11 demonstrated excellent thermal conductivity and excellent processability and possessed a melting temperature of 190° C. or less.

In contrast, the composites of Comparative Examples 1 to 3 had a melting temperature of 190° C. or greater, and though the melting temperature are in general acceptable, each of the comparative examples were inappropriate as materials for a semiconductor package because the thermal conductivity was too low.

The epoxy compound according to an embodiment is highly thermally conductive and exhibits high heat dissipating properties. Moreover, a composition including the epoxy compound according to an embodiment exhibits high thermal conductivity. The composition including the epoxy compound may further include relatively less amount of filler content. The highly thermally conductive epoxy compound may be applied to various semiconductor packaging and electronic fields requiring heat dissipating properties.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An epoxy compound comprising a naphthalene unit, and represented by Chemical Formula 1:

$E_1$-$M_1$-$L_1$-$M_2$-$L_2$-$M_3$-$E_2$  Chemical Formula 1 in Chemical Formula 1,
$M_1$, $M_2$, and $M_3$ are each independently a mesogenic unit represented by Chemical Formula 2, wherein at least one of $M_1$ or $M_3$ is a naphthalene unit represented by Formula (2-1), $L_1$ and $L_2$ are each independently —O—, —C(=O)O—, —O—C(=O)—, —O—C(=O)O—, —(CH$_2$)$_2$—C(=O)—, —C(=O)—(CH$_2$)$_2$—, —CH=CH—C(=O)—, —C(=O)—CH=CH—, —S(O)$_2$—, —CH=N—, —N=CH—, —NHC(=O)O—, —OC(=O)NH—, —C(=O)NH—, —NHC(=O)—, —OC(=O)NHS(=O)O—, —OS(=O)NHC(=O)O—, —CH$_2$(C$_6$H$_4$)C(=O)—, or —C(=O)(C$_6$H$_4$)CH$_2$—, and $E_1$ and $E_2$ are the same or different epoxy-containing group:

Chemical Formula 2

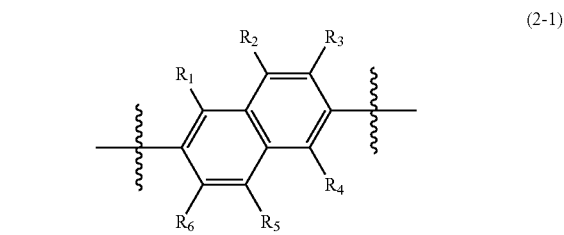
(2-1)

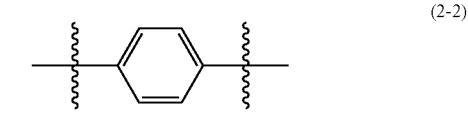
(2-2)

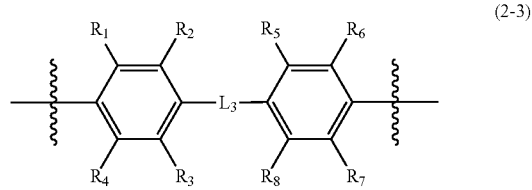
(2-3)

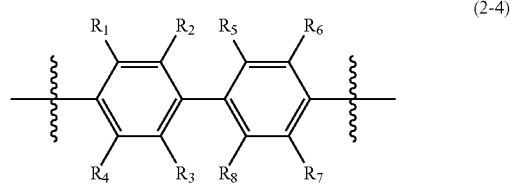
(2-4)

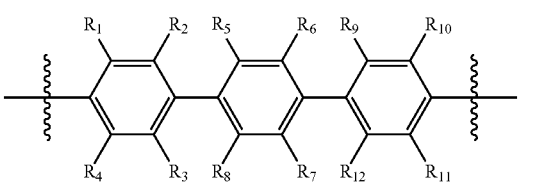
(2-5)

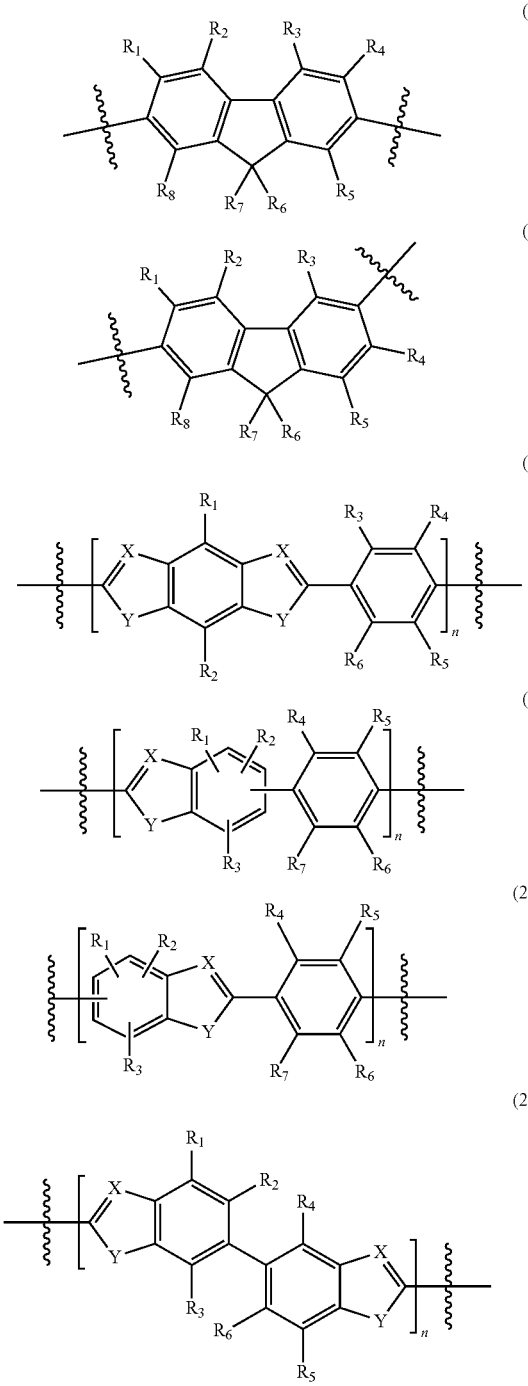

wherein, in Chemical Formula 2,

R$_1$ to R$_{12}$ are each independently a hydrogen atom, a halogen atom, an alkyl group of C1-C30, an alkenyl group of C2-C30, an alkynyl group of C2-C30, a C1-C30 alkoxy group, a C2-C30 alkoxyalkyl group, a C1-C30 heteroalkyl group, an aryl group of C6-C30, an arylalkyl group of C7-C30, a heteroaryl group of C2-C30, a heteroarylalkyl group of C3-C30, a heteroaryloxy group of C2-C30, a heteroaryloxyalkyl group of C3-C30, a heteroarylalkyloxy group of C3-C30, a hydroxyl group, a nitro group, a cyano group, an amino group, an amidino group, a hydrazine group, a hydrazone group, a carboxyl group or a salt thereof, a sulfonyl group, a sulfamoyl group, a sulfonic acid group or a salt thereof, or phosphoric acid group or a salt thereof, L$_3$ of chemical formula (2-3) is —O—, —C(=O)O—, —O—C(=O)—, —O—C(=O)O—, —(CH$_2$)$_2$—C(=O)—, —C(=O)—(CH$_2$)$_2$—, —CH=CH—C(=O)—, —C(=O)—CH=CH—, —S(O)$_2$—, —CH=N—, —N=CH—, —NHC(=O)O—, —OC(=O)NH—, —C(=O)NH—, —NHC(=O)—, —OC(=O)NHS(=O)O—, —OS(=O)NHC(=O)O—, —CH$_2$(C$_6$H$_4$)C(=O)—, or —C(=O)(C$_6$H$_4$)CH$_2$—, X is N, P, or As, Y is O, S, or Se, and n is an integer of 1 to 10.

2. The epoxy compound of claim 1, wherein, in Chemical Formula 2, R$_1$ to R$_{12}$ are each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group.

3. The epoxy compound of claim 1, wherein with the at least one mesogenic unit M$_1$ or M$_3$ being

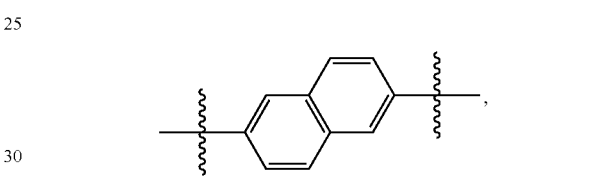

the remaining mesogenic units M$_1$ and M$_2$, or M$_3$ and M$_2$, are independently represented by Chemical Formula 2a:

Chemical Formula 2a

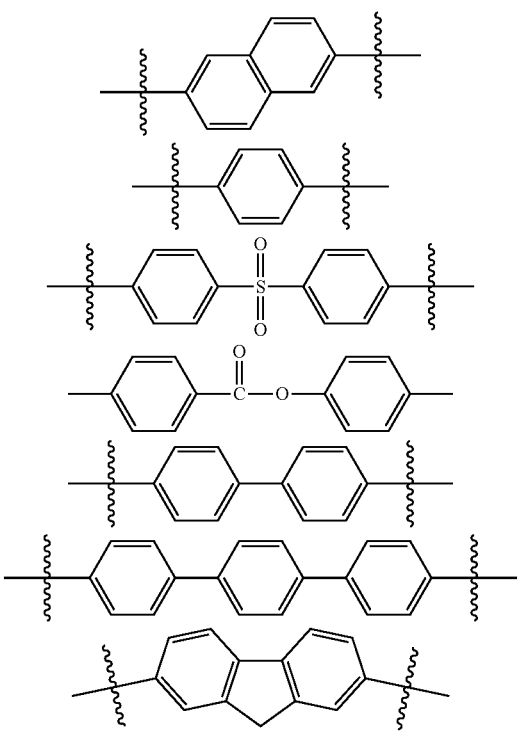

-continued

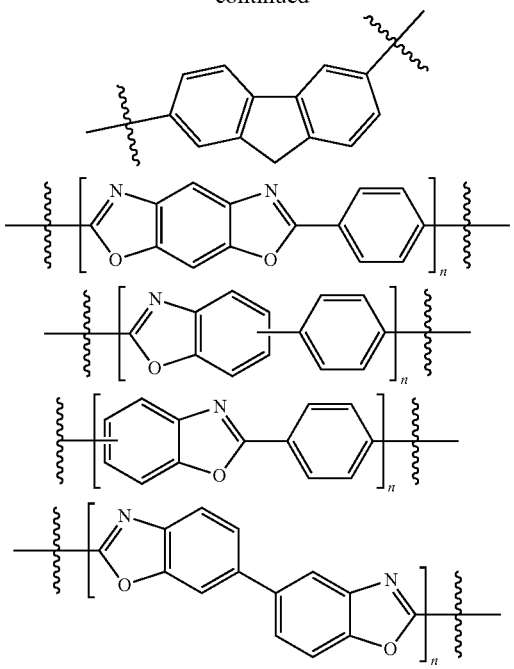

in Chemical Formula 2a, n is an integer of 1 to 10.

4. The epoxy compound of claim 3, wherein the remaining mesogenic units $M_1$ and $M_2$, or $M_3$ and $M_2$, are independently

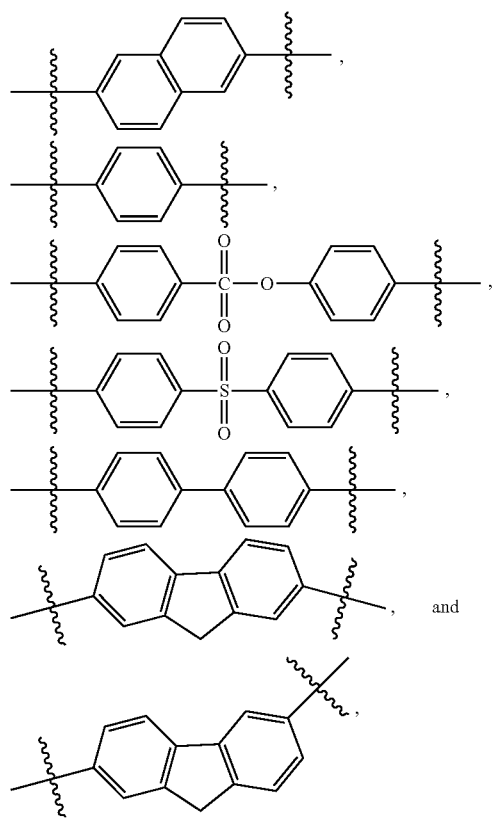

$L_1$ and $L_2$ are selected from —C(=O)O—, —OC(=O)—, —CH=N—, —N=CH—, and a single bond, and $E_1$ and $E_2$ are

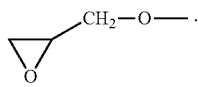

5. The epoxy compound of claim 1, wherein, in Chemical Formula 1, $M_1$ and $M_3$ are of Chemical Formula 2-1

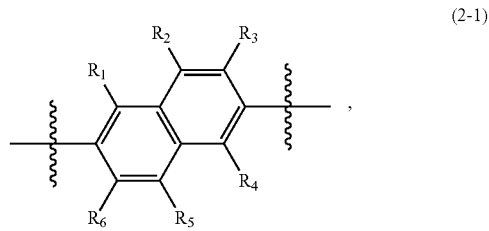

and $R_1$ to $R_6$ are the same in Chemical Formula 2-1.

6. The epoxy compound of claim 1, wherein, in Chemical Formula 1, $M_2$ is a mesogenic unit of Chemical Formula 2, but is not a naphthalene unit of Chemical Formula 2-1.

7. The epoxy compound of claim 1, wherein the epoxy-containing groups E1 and E2 are each independently represented by a group of Chemical Formula 3:

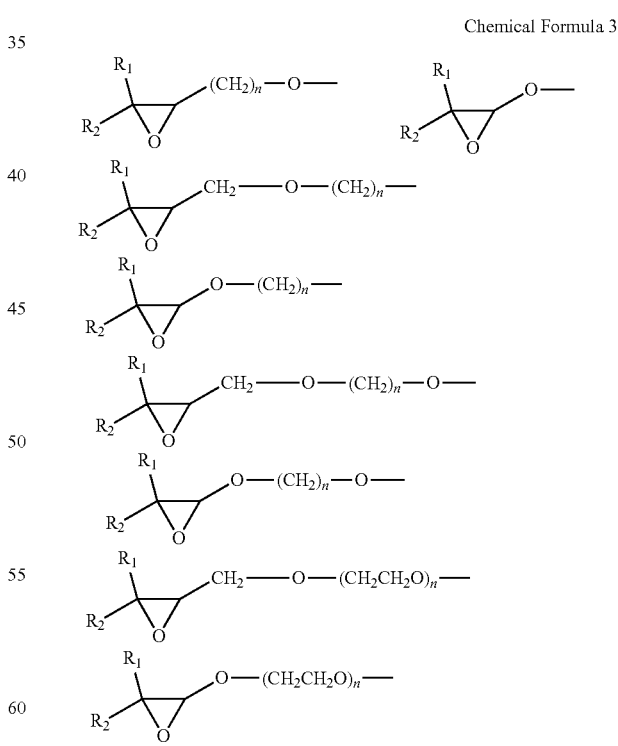

in Chemical Formula 3, $R_1$ and $R_2$ are each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group, and n is an integer of 1 to 10.

8. The epoxy compound of claim 1, wherein the epoxy-containing groups $E_1$ and $E_2$ are each independently represented by a group of Chemical Formula 3a:

Chemical Formula 3a

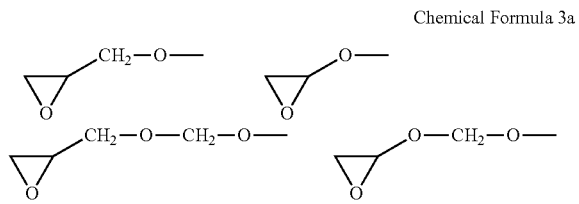

-continued

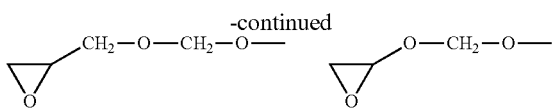

9. The epoxy compound of claim 1, wherein the epoxy compound comprises at least one compound of Chemical Formula 4:

Chemical Formula 4

(4-2)

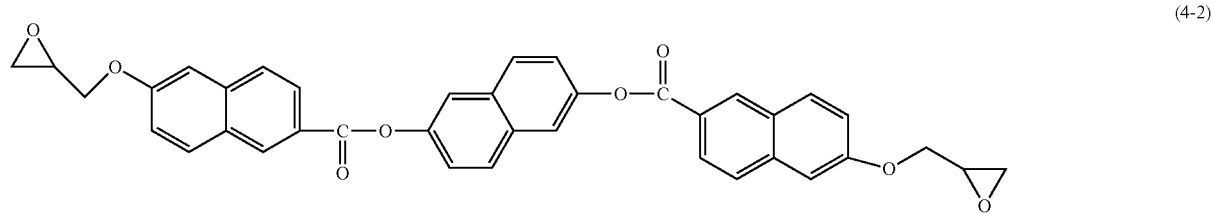

(4-3)

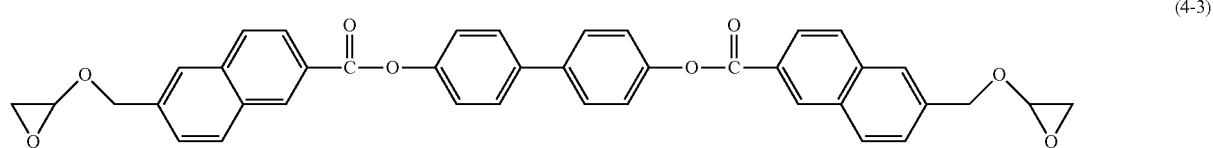

(4-4)

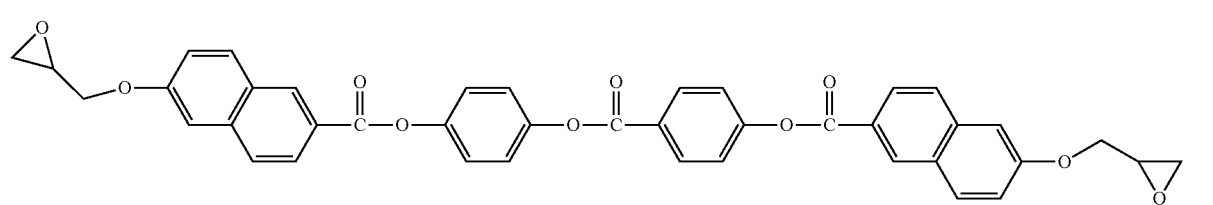

(4-5)

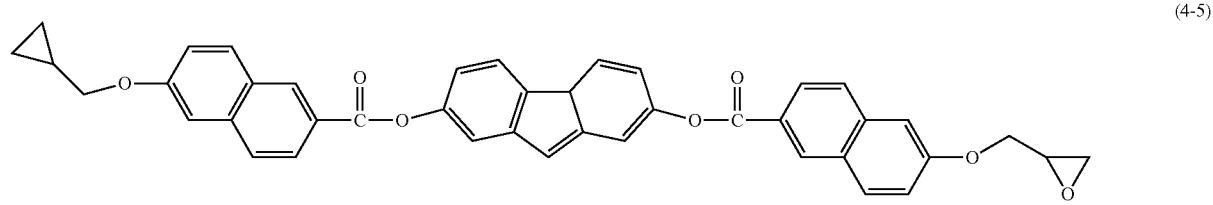

(4-6)

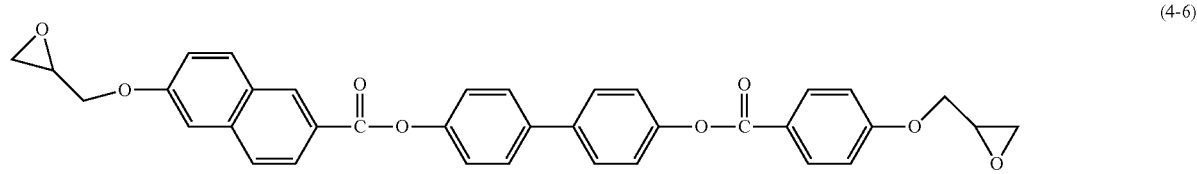

(4-7)

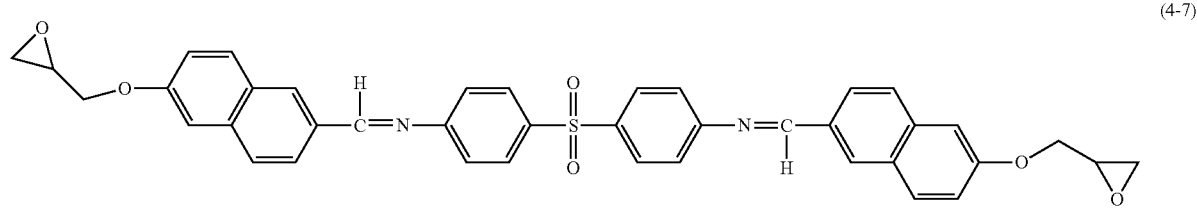

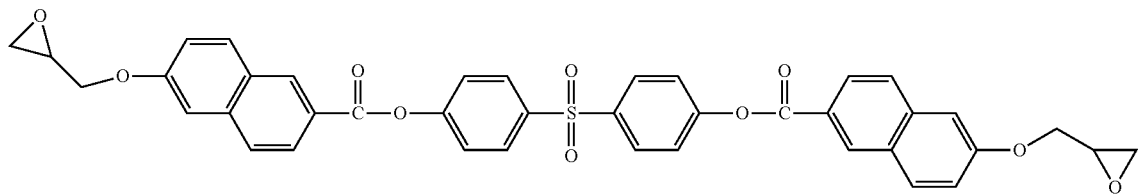
(4-8)

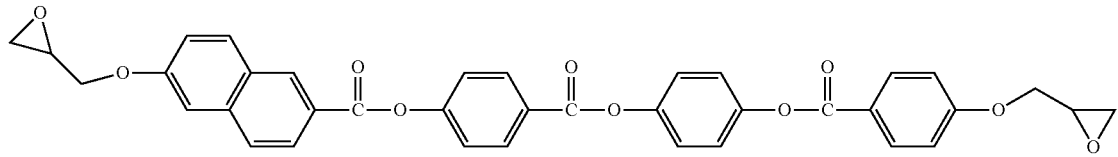
(4-9)

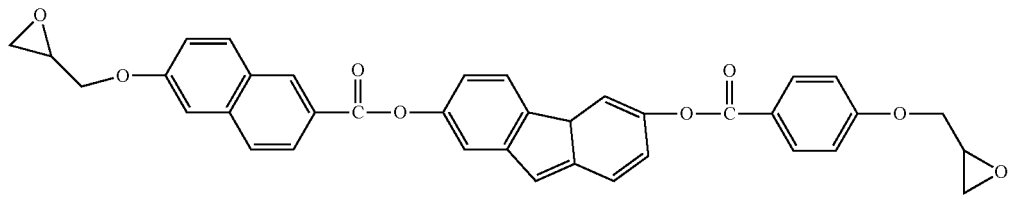
(4-10)

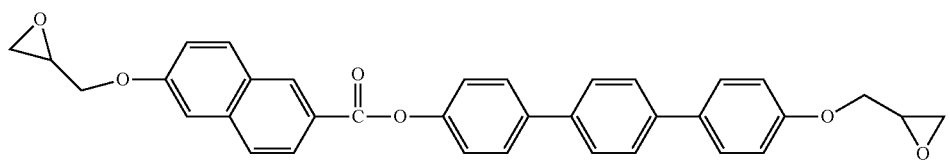
(4-11)

10. The epoxy compound of claim 1, having a melting temperature of about 190° C. or less.

11. The epoxy compound of claim 1, having a thermal conductivity of about 0.4 Watts per meter-Kelvin or greater.

12. A composition comprising the epoxy compound according to claim 1.

13. The composition of claim 12, further comprising a filler, the filler comprising an inorganic material, an organic material, or a combination thereof.

14. The composition of claim 13, wherein the inorganic material comprises at least one of silicon oxide, calcium carbonate, magnesium carbonate, alumina, magnesia, clay, titania, talc, calcium silicate, antimony oxide, glass fiber, or eucryptite ceramic, and the organic material comprises at least one of polyethyleneimine, ethylene glycol, or polyethylene glycol.

15. The composition of claim 13, wherein the filler is from about 40 parts by weight to about 99 parts by weight based on about 100 parts by weight of the epoxy compound.

16. The composition of claim 12, further comprising at least one of a curing agent, a curing accelerator, a reaction controlling agent, a release agent, a coupling agent, a stress relief agent, or an auxiliary flame retardant.

17. A semiconductor package comprising the composition of claim 12.

18. A material for a semiconductor package, the material comprising the epoxy compound according to claim 1.

* * * * *